(12) United States Patent  
Lee et al.

(10) Patent No.: US 8,980,049 B2
(45) Date of Patent: Mar. 17, 2015

(54) APPARATUS FOR SUPPORTING SUBSTRATE AND PLASMA ETCHING APPARATUS HAVING THE SAME

(75) Inventors: Won Haeng Lee, Chungcheongnam-Do (KR); Kwan Goo Rha, Gyeonggi-Do (KR); Jung Hee Lee, Incheon (KR); Chul Hee Jang, Gyeonggi-Do (KR); Hyang Joo Lee, Gyeonggi-Do (KR); Dong Wan Kim, Gyeonggi-Do (KR)

(73) Assignee: Charm Engineering Co., Ltd. (KR)

( * ) Notice: Subject to any disclaimer, the term of this patent is extended or adjusted under 35 U.S.C. 154(b) by 1122 days.

(21) Appl. No.: 12/531,068

(22) PCT Filed: Apr. 1, 2008

(86) PCT No.: PCT/KR2008/001824
§ 371 (c)(1),
(2), (4) Date: Sep. 13, 2009

(87) PCT Pub. No.: WO2008/120946
PCT Pub. Date: Oct. 9, 2008

(65) Prior Publication Data
US 2010/0096084 A1    Apr. 22, 2010

(30) Foreign Application Priority Data

Apr. 2, 2007  (KR) .................. 10-2007-0032301
May 3, 2007  (KR) .................. 10-2007-0043146
May 15, 2007 (KR) .................. 10-2007-0047179

(51) Int. Cl.
*C23C 16/00*  (2006.01)
*H01L 21/306*  (2006.01)
*H01L 21/67*  (2006.01)
(Continued)

(52) U.S. Cl.
CPC ...... *H01L 21/67069* (2013.01); *H01L 21/6831* (2013.01); *H01L 21/68742* (2013.01)
USPC ................................. 156/345.48; 118/723 IR

(58) Field of Classification Search
CPC  H01J 37/321; H01J 37/3211; H01J 37/32119
USPC ......... 118/723 I, 723 IR, 723 AN; 156/345.3, 156/345.48, 345.49; 315/111.51
See application file for complete search history.

(56) References Cited

U.S. PATENT DOCUMENTS 5,571,366 A * 11/1996 Ishii et al. ................ 156/345.26
5,647,945 A *  7/1997 Matsuse et al. .......... 156/345.38
5,763,851 A *  6/1998 Forster et al. ............ 219/121.43
(Continued)

FOREIGN PATENT DOCUMENTS

JP   05-082630    4/1993
JP   06177081    6/1994
(Continued)

*Primary Examiner* — Luz Alejandro Mulero

(57) ABSTRACT

Provided are a substrate supporting apparatus and a plasma etching apparatus having the same. There is provided a substrate supporting apparatus that can separately provide powers to a central region and an edge region by disposing an electrode supporting a substrate at the central region of the substrate supporting apparatus, and disposing an electrode receiving radio frequency (RF) power at the edge region of the substrate supporting apparatus. There is provided a substrate edge etching apparatus having the substrate supporting apparatus for removing layers or particles deposited in an edge region of a semiconductor substrate and preventing damage of a center region of the semiconductor substrate during an etching process of the substrate edge.

14 Claims, 13 Drawing Sheets

(51) Int. Cl.
*H01L 21/683* (2006.01)
*H01L 21/687* (2006.01)

(56) References Cited

U.S. PATENT DOCUMENTS

| | | | |
|---|---|---|---|
| 5,800,621 A * | 9/1998 | Redeker et al. | 118/723 AN |
| 6,261,406 B1 * | 7/2001 | Jurgensen et al. | 156/345.3 |
| 2002/0088548 A1 * | 7/2002 | Kim et al. | 156/345.48 |
| 2005/0014382 A1 | 1/2005 | Lee et al. | |
| 2005/0103623 A1 * | 5/2005 | Tolmachev et al. | 204/298.06 |
| 2007/0029044 A1 * | 2/2007 | Jeon | 156/345.3 |
| 2007/0068900 A1 * | 3/2007 | Kim et al. | 216/67 |
| 2008/0099426 A1 * | 5/2008 | Kumar et al. | 216/12 |
| 2008/0099431 A1 * | 5/2008 | Kumar et al. | 216/44 |
| 2009/0114244 A1 * | 5/2009 | Sexton et al. | 134/1.1 |

FOREIGN PATENT DOCUMENTS

| | | | |
|---|---|---|---|
| JP | 7153748 | | 6/1995 |
| JP | 09-287081 | | 11/1997 |
| JP | 11061448 | | 3/1999 |
| JP | 2001-093884 | | 4/2001 |
| JP | 2005167283 | A | 6/2005 |
| JP | 2005519469 | A | 6/2005 |
| JP | 2006120875 | A | 5/2006 |
| JP | 2007043148 | A | 2/2007 |
| JP | 2007067037 | A | 3/2007 |
| KR | 1998070120 | | 10/1998 |
| KR | 1999-0031610 | | 5/1999 |
| KR | 2001-0105238 | | 11/2001 |
| KR | 2003-0083729 | | 10/2003 |
| KR | 20060003891 | A | 1/2006 |
| KR | 10-2006-0014222 | | 2/2006 |
| KR | 20060014801 | A | 2/2006 |
| KR | 20060060997 | A | 6/2006 |
| KR | 10-2007-0001493 | | 1/2007 |
| KR | 20070014601 | A | 2/2007 |
| WO | WO2004100247 | | 11/2004 |

* cited by examiner

APPARATUS FOR SUPPORTING SUBSTRATE AND PLASMA ETCHING APPARATUS HAVING THE SAME

TECHNICAL FIELD

The present disclosure relates to an apparatus for supporting a substrate and a plasma etching apparatus having the same, and more particularly, to a plasma etching apparatus that can separately provide powers to a central region and an edge region by disposing an electrode supporting a substrate at the central region of the substrate supporting apparatus, and disposing an electrode receiving radio frequency (RF) power at the edge region of the substrate supporting apparatus, so that thin layers or particles deposited in an edge region of the substrate can be removed using plasma.

BACKGROUND ART

Generally, devices or circuit patterns are not formed in an edge region of a semi-conductor substrate since the edge region is used for conveying the semiconductor substrate. However, undesired layers or particles can be deposited on the edge region of the semiconductor substrate during manufacturing processes. If the manufacturing processes are continued without removing the undesired layers or particles from the semiconductor substrate, the semiconductor substrate can be deformed, or the yield of the manufacturing can be reduced. In addition, it may be difficult to align the semiconductor substrate due to the undesired layers or particles.

For these reasons, the undesired layers or particles deposited in the edge region of the substrate should be removed through a predetermined post process. For example, the undesired layers or particles can be removed from the edge region of the semiconductor substrate through a wet etch process using a predetermined chemical. Recently, however, plasma is selectively supplied to the edge region of the substrate to remove undesired layers or particles from the edge region of the semiconductor substrate.

A conventional etching apparatus for etching of an edge region of a semiconductor using plasma is disclosed in Korean Patent Publication No. 10-0635377. The plasma etching apparatus for edge region of the semiconductor in accordance with the Korean Patent Publication supplies reaction gas to a peripheral region of an insulation plate which has a shape corresponding to a non-etch region, i.e., a center region of a semiconductor substrate and is disposed thereabove. The plasma etching apparatus converts the reaction gas in the peripheral region of the insulation plate into plasma using an electrode portion which is disposed at an outer upper portion of a chamber, and removes layers or particles deposited in an edge region of the semiconductor substrate. However, it is difficult to concentrate plasma onto the edge region of the substrate since the electrode portion is disposed at the outer upper portion of the chamber.

In the above described conventional etching apparatus using only CCP, the CCP can penetrate from the edge region to the center region (non-etch region) of the semiconductor substrate, the reaction gas can be converted into CCP in the center region of the semiconductor substrate, or undesired arcing can occur. Furthermore, necessary layers formed on the center region (non-etch region) of the semiconductor substrate can be etched by reaction gas penetrated into the center region.

Furthermore, since the density of the CCP is low (i.e., the etch rate of the conventional etching apparatus is low), it takes much time to remove undesired layers or particles from the edge region of the semiconductor substrate. Moreover, some layers cannot be removed using the conventional etching apparatus.

In addition, due to a low process temperature, it is difficult to remove a metal layer from the edge region of the semiconductor substrate using the conventional etching apparatus. Particularly, some metal layers such as a copper (Cu) layer are not removed.

A semiconductor device is manufactured through a process of depositing or etching a predetermined layer on a semiconductor substrate. This process is performed inside a chamber, which is a closed type container having a unique process environment. Generally, a chuck, which is a unit fixing a semiconductor substrate, is installed inside the chamber to support a substrate loaded inside the chamber.

The chuck is classified into a mechanical chuck, a vacuum chuck, and an electrostatic chuck in accordance with a method for fixing a substrate. The electrostatic chuck fixes and supports a substrate using a voltage difference (static electricity) between the substrate and an electrode inside the chuck. Since the electrostatic chuck can maintain uniform gripping force, it is used for various chambers.

The electrostatic chuck is used for fixing a substrate also in a substrate edge etching apparatus configured to remove a layer or particles on a substrate edge region. However, the substrate edge etching apparatus should expose a substrate edge region and concentrate plasma on the exposed region. In accordance with a conventional electrostatic chuck, a single electrode is formed inside a ceramic, and direct current (DC) power or RF power is supplied to the electrode. Accordingly, the life of a coated layer on an electrostatic chuck body is reduced. Particularly, in a case where the electrostatic chuck is used for a substrate edge etching apparatus, plasma density on a substrate edge region is reduced, so that etching the substrate edge region is not efficiently performed, and a substrate central region, which is a non-etch region, is damaged by plasma.

DISCLOSURE OF INVENTION

Technical Problem

The present disclosure provides a plasma etching apparatus configured to easily remove metal thin layers such as a copper (Cu) layer deposited in an edge region of a substrate by generating high-density plasma, concentrating the plasma onto the edge region of the substrate, and heating a chamber including a substrate support.

The present disclosure provides an apparatus for etching an edge region of a substrate capable of concentrating plasma onto the edge region of the substrate and preventing etch gas converted to plasma from penetrating into a center region of the substrate, so that layers or patterns formed on the center region of the substrate can be protected.

The present disclosure provides a substrate supporting apparatus that separately provides an electrode pattern supporting a substrate and another electrode pattern applying high frequency waves inside an electrostatic chuck, and applies power for supporting the substrate and high frequency power to the electrode patterns, respectively, to improve plasma density on a substrate edge region and prevent central region of a substrate from being damaged by plasma, and a substrate edge etching apparatus having the same.

Technical Solution

In accordance with an exemplary embodiment, a plasma etching apparatus, including: a chamber including a reaction compartment; a plasma generator disposed at the chamber; a mask part disposed in the reaction compartment; a substrate support disposed under the mask part; and a gas supply unit configured to supply a process gas to the reaction compartment.

The chamber may include upper and lower chambers that are detachably coupled to each other and include a heating unit, wherein a through hole is disposed in an upper wall of the lower chamber, and the upper chamber may include a recess corresponding to the through hole.

The heating unit may include: a hot wire disposed in walls of the upper and lower chambers or on sides of the upper and lower chambers; and a power supply configured to supply power to the hot wire. The heating unit may be disposed in an upper wall or on the side of the upper chamber, and in a sidewall or on the sidewall of the lower chamber.

The plasma etching apparatus may further include a shield part configured to form a separation compartment in the chamber.

The shield part may be formed to have a ring shape extending from an upper wall to a sidewall of the chamber.

The chamber may include upper and lower chambers that are detachably coupled to each other and include a heating unit, wherein the shield part may be formed to have a ring shape extending from an upper wall of the lower chamber to an upper wall of the upper chamber.

The plasma generator may include: an antenna part disposed in the separation compartment outside the shield part; and a plasma power supply configured to supply plasma power to the antenna part.

The plasma etching apparatus may further include a Faraday shield disposed around a periphery of the shield part.

The substrate support may be configured to expose an edge region of the substrate having approximately 0.1 mm to 5 mm width; the substrate support may be disposed adjacent to the mask part so that the distance between the substrate support and the mask part is approximately 0.1 mm to 10; and the mask part may be manufactured to have the same diameter as the substrate support or the substrate.

The plasma etching apparatus may further include an upper electrode disposed at a peripheral portion of the mask part.

The plasma etching apparatus may further include: a lower electrode disposed at a peripheral portion of the substrate support; and an insulation layer disposed between the lower electrode and the substrate support.

The plasma etching apparatus may further include a substrate heating unit disposed in the substrate support for heating the substrate support.

In accordance with another exemplary embodiment, a plasma etching apparatus, including: a substrate support configured to support a center region of a substrate; a mask part disposed above the substrate support to cover the center region of the substrate; a chamber configured to accommodate the substrate support and the mask part, the chamber including a heating unit disposed at a wall thereof; a plasma generator configured to generate plasma in a region surrounded by the substrate support, the mask part and a sidewall of the chamber; and a gas supply unit configured to supply a process gas to an inner region of the chamber.

The plasma generator may include: an antenna part disposed in a region around the mask part in the chamber; and a plasma power supply configured to supply plasma power to the antenna part. The plasma etching apparatus may further include a shield part disposed between the antenna part and the mask part so as to separate the antenna part from the inner region of the chamber.

The plasma etching apparatus may further include a Faraday shield disposed between the shield part and the antenna part.

The heating unit may include: a hot wire disposed at the wall of the chamber; and a power supply configured to supply power to the hot wire.

In accordance with an exemplary embodiment, an apparatus for etching a substrate edge includes: a chamber including a reaction compartment; a mask part disposed in the reaction compartment; a substrate support disposed under the mask part; an inert gas supply unit configured to supply an inert gas to a bottom surface region of the mask part; and a process gas supply unit configured to supply a process gas to a lateral surface region of the mask part.

The inert gas supply unit may include: an inert gas tank; and an extension passage extending from the inert gas tank into the mask part. The inert gas supply unit may further include: a plurality of branch passages branching off from the extension passage; and a plurality of injection nozzle parts extending from the branch passages to a bottom surface of the mask part. The branch passages may branch off from the extension passage in radial directions, and outer injection nozzle parts of the injection nozzle parts may be arranged in a circular shape. Each of the injection nozzle parts may include: an injection hole disposed in the bottom surface of the mask part; and a nozzle passage connected between the injection hole and the branch passage, wherein the nozzle passage tapers toward the injection hole.

The apparatus may further include a baffle configured to uniformly inject inert gas from the inert gas supply unit to the bottom surface region of the mask part. The mask part may include a recess disposed in a bottom surface of the mask part and connected to the inert gas supply unit, and the baffle may be disposed at an entrance of the recess. The baffle may have a circular plate shape, and the inert gas supply unit may include an extension passage connected to a region of the recess opposite to the baffle.

The baffle may be disposed at a center region of a bottom surface of the mask part, and a distance between the baffle and a substrate may be equal to or smaller than a distance between the mask part and the substrate.

The process gas supply unit may include: a process gas tank; a gas pipe extending to a sidewall surface region of the mask part through the mask part; and an injector disposed along a sidewall surface of the mask part for injecting a process gas received from the gas pipe.

The apparatus may further include an electrode disposed at a sidewall of the mask part. The process gas supply unit may include: an injector provided to at least one of a lateral surface and a bottom surface of the electrode; and a gas pipe configured to supply a process gas to the injector through the mask part and the electrode. Alternatively, the process gas supply unit may include: an injector provided to at least one of a lateral surface and a bottom surface of the electrode; and a gas pipe configured to supply a process gas to the injection nozzle part through the electrode.

The process gas supply unit may include a gas passage disposed between the chamber and the mask part for transferring a process gas. In this case, the apparatus may further include an electrode disposed at a sidewall of the mask part, and a process gas transferred along the gas passage may be injected through a region between the mask part and the electrode.

The apparatus may further include a plasma generator configured to generate plasma in lateral regions of the mask part and the substrate support.

The chamber may include upper and lower chambers that are detachably coupled to each other and include a heating unit, wherein the lower chamber may include a through hole in a top wall, and the upper chamber includes a recess corresponding to the through hole.

The apparatus may further include a shield part configured to form a separation compartment in the chamber.

The apparatus may further include a Faraday shield disposed around a periphery of the shield part.

The apparatus may further include: a lower electrode disposed at a peripheral portion of the substrate support; and an insulation layer disposed between the lower electrode and the substrate support.

In accordance with an exemplary embodiment, a substrate supporting apparatus includes: a body portion on which a substrate is seated; a first electrode provided at a central region inside the body portion; a second electrode provided at an edge region inside the body portion; a fixing power supply unit configured to supply power to the first electrode to fix the substrate; and a bias power supply unit configured to supply bias power to the second electrode.

The body portion may support a central region of the substrate, and expose an edge region of the substrate.

The first electrode may be formed in a circular plate shape, and the second electrode may be formed in a ring shape provided around the first electrode.

The first and second electrodes may be separated into a plurality of blocks.

The fixing power supply unit may apply direct current (DC) power to the first electrode, and the bias power supply unit may apply high frequency power to the second electrode.

The bias power supply unit may apply the high frequency power to the body portion.

The substrate support apparatus may further include an elevator configured to elevate the body portion, and a stage configured to apply driving force to the elevator.

A high frequency line pipe, a DC power line pipe, a refrigerant pipe, and a lift pin pipe may be located in the central region of the body portion.

In accordance with another exemplary embodiment, a substrate edge etching apparatus includes: a chamber having a reaction compartment; a mask part provided in the reaction compartment; and a substrate support including a first electrode configured to grip a substrate, and a second electrode configured to induce plasma, the substrate support being disposed below the mask part.

The substrate support may include: a body portion on which the substrate is seated; the first electrode provided at a central region inside the body portion; the second electrode provided at an edge region inside the body portion; a fixing power supply unit configured to supply power to the first electrode to fix the substrate; and a bias power supply unit configured to supply bias power to the second electrode.

The first electrode may be formed in a circular plate shape, and the second electrode may be formed in a ring shape provided around the first electrode.

The first and second electrodes may be separated into a plurality of blocks.

The fixing power supply unit may apply direct current (DC) power to the first electrode, and the bias power supply unit may apply high frequency power to the second electrode.

The bias power supply unit may apply the high frequency power to the body portion.

A high frequency line pipe, a DC power line pipe, a refrigerant pipe, and a lift pin pipe may be located in the central region of the body portion.

The substrate support may grip a rear central region of the substrate, and expose an edge region of the substrate, and the mask part may shield a front central region of the substrate.

The chamber may include an upper chamber and a lower chamber detachably coupled to each other, a through hole may be formed in an upper wall of the lower chamber, and the upper chamber may include a recess corresponding to the through hole.

The substrate edge etching apparatus may further include an elevator configured to elevate the substrate support, and a stage configured to apply driving force to the elevator.

Advantageous Effects

As described above, since the heating units are disposed in the wall of the chamber and the substrate support to heat a substrate introduced into the chamber, the edge region of the substrate can be etched more efficiently.

Furthermore, the shield part is disposed around an edge region of a substrate, and the antenna for generating plasma is disposed outside the shield part. Since the antenna is disposed around a side of the edge region of the substrate, high-density plasma can be generated in the chamber, and the high-density plasma can be uniformed concentrated onto the edge region of the substrate by disposing the Faraday shield between the shield part and the antenna.

As described above, inert gas is injected to an upper region of a non-etch region of a substrate through a mask part which covers the non-etch region of the substrate. Therefore, penetration of process gas to the non-etch region of the substrate can be prevented, and thus patterns disposed on the non-etch region can be protected.

As described above, the substrate supporting apparatus and the substrate edge etching apparatus having the same provide the electrode supporting the substrate to the center of the body of the substrate support, and provides the electrode applying high frequency waves to the edge of the body to maintain substrate gripping force of the substrate support, improve etching capability using plasma on the substrate edge region, and prevent damage of the substrate central region caused by the plasma.

Also, the substrate supporting apparatus and the substrate edge etching apparatus having the same provide members for refrigerant and heating as well as members for high frequency waves and DC power to the central region of the body of the substrate support to minimize a change in the process condition on the edge region of the body.

BRIEF DESCRIPTION OF THE DRAWINGS

Exemplary embodiments can be understood in more detail from the following description taken in conjunction with the accompanying drawings, in which.

BEST MODE FOR CARRYING OUT THE INVENTION

Figure 1:
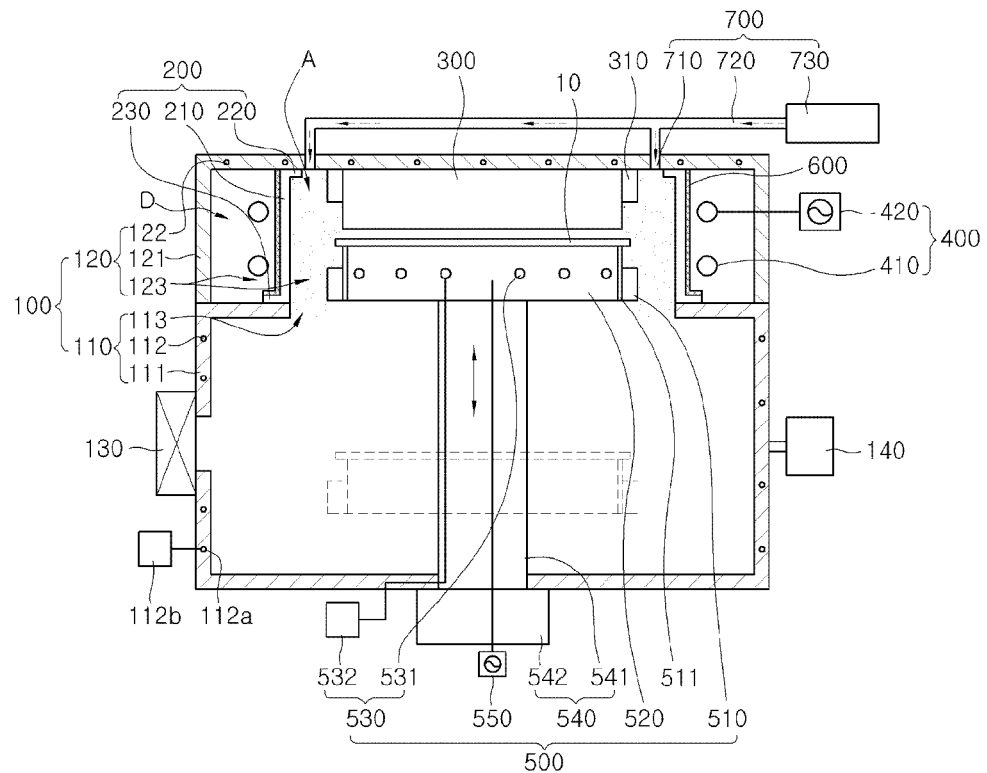
FIG. 1 is a schematic view illustrating a plasma etching apparatus in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, like reference numerals refer to like elements throughout.

Figure 2:
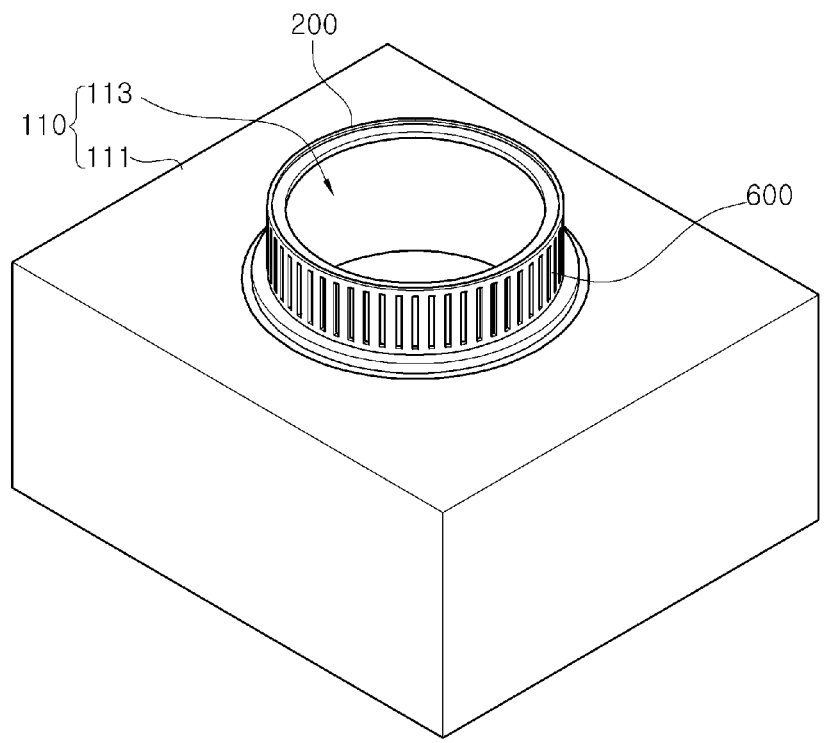
FIG. 2 is a perspective view illustrating a lower chamber in accordance with the exemplary embodiment.
Figure 3:
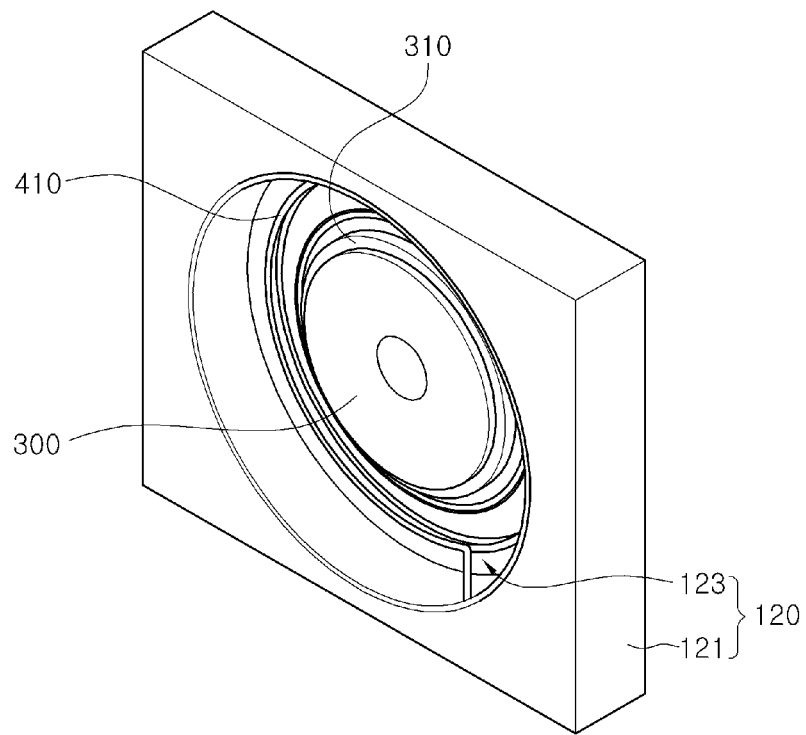
FIG. 3 is a perspective view illustrating an upper chamber in accordance with the exemplary embodiment.
Figure 4:
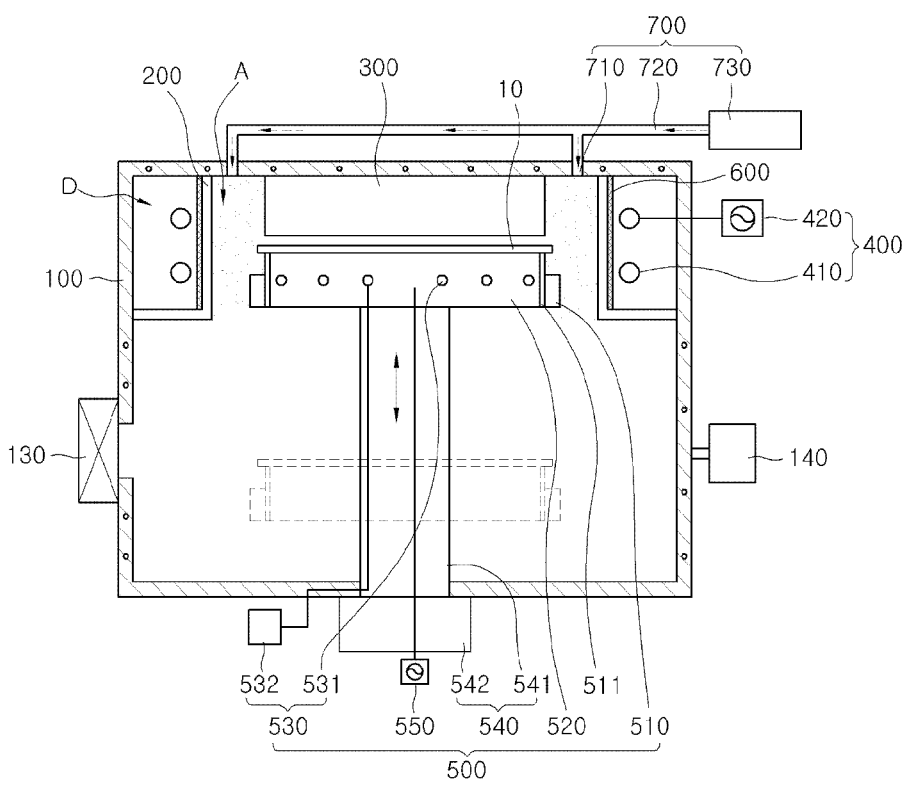
FIGS. 4 and 5 are schematic views illustrating variants of the plasma etching apparatuses in accordance with the exemplary embodiments.
Figure 5:
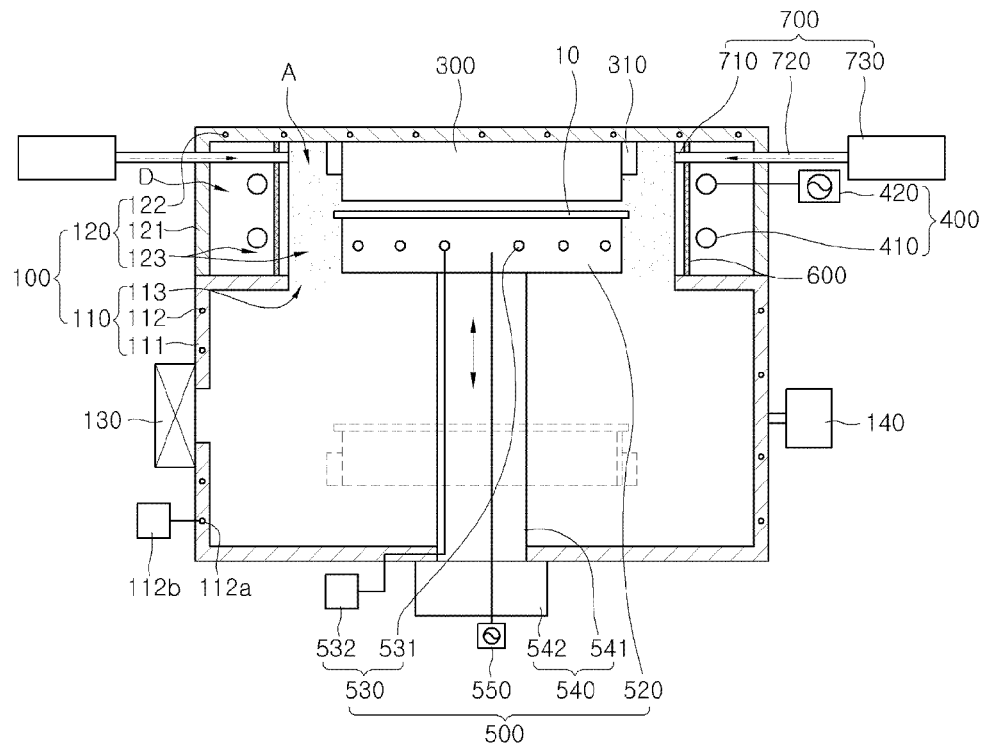

FIG. 1 is a schematic view illustrating a plasma etching apparatus in accordance with a first exemplary embodiment. FIG. 2 is a perspective view illustrating a lower chamber in accordance with the first exemplary embodiment, and FIG. 3 is a perspective view illustrating an upper chamber in accordance with the exemplary embodiment. FIGS. 4 and 5 are schematic views illustrating variants of the plasma etching apparatuses in accordance with the exemplary embodiments.

Referring to FIGS. 1 through 5, the plasma etching apparatus in accordance with the exemplary embodiment includes a chamber 100, a shield part 200 dividing an inside of the chamber into a reaction compartment A and a separation compartment D, a mask part 300 disposed in the reaction compartment A in the shield part 200, a plasma generator 400 disposed in the separation compartment D in the outer region of the shield part 200, and a substrate support 500 disposed under the mask part 300. The plasma etching apparatus may further include a Faraday shield 600 between the mask part 300 and the plasma generator 400. A center region of a substrate 10 is screened by the mask part 300 and the substrate support 500, and thus only an edge region of the substrate 10 is exposed.

The chamber 100 includes a lower chamber 110 having a lower heating unit 112 and an upper chamber 120 having an upper heating unit 122.

The lower chamber 110 may include a lower body 111, the lower heating unit 112, and a through hole 113. The lower body 111 has a hollow and substantially hexahedral shape. The lower heating unit 112 is disposed at least in a sidewall of the lower body 111. The through hole 113 is formed to have a circular shape through an upper wall of the lower body 111. The lower body 111 can be formed into rectangular columnar shape including an upper wall, a bottom wall, and four sidewalls. Alternatively, the lower body 111 can be formed into cylindrical shape or polyhedral shape. Each side of the lower body 111 may be formed to have a polygonal shape. The substrate support 500 on which the substrate 10 is mounted can vertically move up and down inside the hollow portion of the lower body 111. A gate valve 130 for loading and unloading the substrate 10, and an exhaust unit 140 for discharging contaminants from the chamber 100 are disposed on a side of the lower body 111. The gate valve 130 is disposed at a sidewall of the lower body 111 as shown in FIG. 1. The lower chamber 110 can be connected to another chamber (not shown) through the gate valve 130.

The lower heating unit 112 is disposed at least in a portion of the sidewall of the lower body 111 for heating the chamber 100. The lower heating unit 112 can be disposed in the sidewalls of the lower body 111 as shown in FIG. 1. The lower body 111 is heated by the lower heating unit 112, and the temperature of the lower body 111 is controlled by the lower heating unit 112. Therefore, the inner temperature of the lower body 111 can be stably kept without sudden changes by external environment. An electric heater may be used as the lower heating unit 112. The lower heating unit 112 may include a plurality of hot wires 112a provided in the lower body 111 or in a side of the lower body 111, and a power supply 112b configured to supply electricity to the plurality of hot wires 112a. However, the present invention is not limited thereto. Alternatively, the lower heating unit 112 can be a lamp heater. As such, the lower heating unit 112 is disposed in the lower body 111, that is, inside the sidewall of the body or in a side of the lower body 111, so that the edge region of the substrate 10 can be intensively heated from the time of loading the substrate 10. The heated edge region of the substrate 10 becomes more reactive, and thus the edge region of the substrate 10 can be etched more efficiently. In a case where the metal layer is deposited in the edge region of the substrate, the reactivity between the metal layer and reaction gas is increased by heating the edge region of the substrate 10. Furthermore, byproducts of the etch reaction are not easily re-deposited on the edge region of the substrate 10 and can be easily discharged through pumping, so that the metal layer can be easily removed. The lower heating unit 112 may be disposed at the upper and/or bottom wall of the lower body 111.

The through hole 113 formed through the upper wall of the lower body 111 may have a diameter greater than that of the substrate 10. The substrate support 500 can move up and down through the through hole 113 toward the outer region of the lower chamber 110.

The upper chamber 120 includes an upper body 121 having a substantially hexagonal shape, the upper heating unit 122 disposed at the upper body 121, and a recess 123 formed in the upper body 121.

The shape of the upper body 121 is not limited thereto. The upper body 121 may have a similar shape to the lower body 111 of the lower chamber 110. The upper body 121 may be manufactured to have a shape to cover the through hole 113 of the lower body 111. That is, the bottom surface of the upper body 121 is in tight contact with the upper surface of the lower body 111.

The recess 123 disposed in the upper body 121 communicates with the through hole 113 of the lower body 111. As shown in FIGS. 1 through 3, the recess 123 can be manufactured so that an opening is provided at a bottom wall of the upper chamber 120 and recessed toward the upper wall of the upper chamber 120. A diameter of the recess 123 may be greater than that of the through hole 113. In the exemplary embodiment, the substrate 10 is disposed in the recess 123 by moving the substrate support 500 up and down. Undesired layers or particles can be removed from the edge region of the substrate 10 by intensively generating plasma in the recess 123.

The upper heating unit 122 is disposed at a portion of the periphery of the recess 123. For example, the upper heating unit 122 can be disposed in a portion of the upper wall of the upper body 121. Like the lower heating unit 112 of the lower body 111, the upper heating unit 112 is used to heat the substrate 10 and facilitate plasma reaction in the edge region of the substrate 10. The heating temperature of the upper and lower heating units 112 and 122 may be approximately 80° C. The heating temperature is not limited thereto. Alternatively, the edge region of the substrate 10 may be heated to a temperature in a range of approximately 50° C. to 150° C. According to the figures, hot wires used as the upper heating unit 122 are uniformly arranged in the upper wall of the upper body 121. However, the hot wires may be concentrated in a region corresponding to the edge region of the substrate 10. The upper heating unit 122 may receive power from a power supply (not shown) separately from the lower heating unit 112. In this way, a temperature difference between upper and lower regions of the chamber 100 can be reduced. Alternatively, the upper heating unit 122 and the lower heating unit 112 can receive power from the same power supply.

Although not shown, the chamber 100 may further include an opening/closing unit for opening and closing between the upper body 121 of the upper chamber 120 and the lower body 111 of the lower chamber 110. Since the chamber 100 is divided into an upper region and a lower region and the chamber 100 is fabricated by assembling the upper and the lower regions, maintenance of the chamber 100 can be easily carried out.

The present invention is not limited thereto, but the chamber 100 may be formed as a single body as shown in FIG. 4 illustrating a variant. That is, the chamber 100 may be formed of a hollow polyhedron or cylinder.

The shield part 200 is manufactured to have a ring shape extending from the upper wall of the lower chamber 110, across the inside of the recess 123, toward the upper wall of the upper chamber 120. The shield part 200 is disposed along the periphery of the through hole 113 to divide the chamber 100 including the lower and upper chambers 110 and 120 into the separation compartment D and the reaction compartment A. In the reaction compartment A, the substrate 10 is disposed, and plasma is generated to etch the edge region of the substrate 10. The separation compartment D accommodates a portion of the plasma generator 400. The reaction compartment A and the separation compartment D may be isolated from each other by the shield part 200. For example, the separation compartment D may be kept atmospheric pressure, and a vacuum may be formed in the reaction compartment A.

The reaction compartment A includes: an inner region of the shield part 200 which is surrounded by the upper wall of the upper chamber 120 and the shield part 200; and an inner space of the lower chamber 110. The separation compartment D includes an outer space of the shield part 200 which is surrounded by the upper wall and sidewalls of the upper chamber 120, the upper wall of the lower chamber 110, and the shield part 200. The shield part 200 may be formed of a material capable of transmitting high-frequency energy and generating plasma inside thereof. For example, the shield part 200 may be formed of an insulating material such as alumina ($Al_2O_3$).

In the exemplary embodiment, after lifting the substrate 10 to the inner region of the shield part 200 using the substrate support 500, the edge region of the substrate 10 can be etched by forming plasma in the inner region of the shield part 200, i.e., a region between the shield part 200 and the substrate support 500.

The shield part 200 includes a hollow ring-shaped body 210, an upper extension 220 provided on an upper portion of the body 210, and a lower extension 230 provided on a lower portion of the body 210. The upper extension 220 is coupled to the upper wall of the upper chamber 120, and the lower extension 230 is coupled to the upper wall of the lower chamber 110. The body 210 is manufactured to have a ring shape which is similar to a shape of the substrate 10. Therefore, a distance between the shield part 200 and the substrate 10 can be kept uniform. Therefore, plasma can be uniformly distributed in the edge region of the substrate 10. The ring-shaped body 210 may have a circular ring shape.

The lower extension 230 is provided on the lower portion of the ring-shaped body 210 and may extend outward from the lower portion of the ring-shaped body 210. The upper extension 220 is provided on the upper portion of the ring-shaped body 210 and may extend inward from the upper portion of the ring-shaped body 210. The present invention is not limited thereto but, alternatively, the lower extension 230 may extend inward from the lower portion of the ring-shaped body 210, and the upper extension 220 may extend outward from the upper portion of the ring-shaped body 210. The upper and lower extensions 220 and 230 that are extended from the upper and lower portions of the ring-shaped body 210 are in tight contact with the upper chamber 120 and the lower chamber 110. Therefore, the reaction compartment A and the separation compartment D can be kept at different pressures. That is, the upper extension 220 and the lower extension 230 function as sealing members to tightly seal the reaction compartment A.

The shield part 200 may be fixed to the lower chamber 110 or the upper chamber 120 through the lower extension 230 or the upper extension 220. Although not shown, sealing members such as o-rings may be additionally disposed at portions of the lower chamber 110 and the upper chamber 120 that are in contact with the shield part 200 so as to securely seal the reaction compartment A. As shown in FIG. 1, the shield part 200 is disposed on surfaces of the lower chamber 110 and the upper chamber 120. However, the present invention is not limited thereto, but a predetermined recess may be formed on surfaces of the lower chamber 110 and the upper chamber 120 that are in contact with the shield part 200. The shield part 220 may be inserted into the recess to improve reliability of sealing of the reaction compartment A. In the above description, the shield part 200 is manufactured separately from the upper and lower chambers 110 and 120. However, the shield part 200 may be manufactured as a single body with the upper and lower chambers 110 and 120.

When the chamber 100 is manufactured as a single body as shown in the variant of FIG. 4, the shield part 200 includes an extension plate portion extending from an upper wall of the chamber 100 and a protrusion plate portion extending from the extension plate portion toward a sidewall of the chamber 100. That is, the shield part 200 has an L-shaped cross section as shown in FIG. 4. In this way, a separation compartment D is formed by the shield part 200 and portions of the upper wall and sidewall. A substrate 10 is moved up to an inner region of the extension plate portion of the shield part 200. An antenna is disposed at an outer side of the extension plate portion to generate plasma in the inner region of the shield part 200, thereby layers and particles deposited in an edge region of the substrate 10 can be removed.

The above-described mask part 300 prevents generation of plasma in the non-etch region (i.e., the center region) of the substrate 10 disposed on the substrate support 500, so that the non-etch region of the substrate 10 cannot be etched. The mask part 300 covers a region of the substrate 10 other than the edge region of the substrate 10. For this, the mask part 300 has a similar shape to the substrate 10. In the exemplary embodiment, the mask part 300 is formed to have a circular plate shape. The mask part 300 may have a smaller size than the substrate 10. In this way, the edge region of the substrate 10 can be selectively exposed by the mask part 300. The edge region of the substrate 10 which is exposed by the mask part 300 may be approximately 0.1 mm to 5 mm wide from an end of the substrate 10.

In this way, the edge region of the substrate 10, on which no layer or semiconductor pattern is formed, is exposed. If the exposed edge region of the substrate 10 is smaller than the above range, the exposed edge region of the substrate 10 is too small. If the exposed edge region of the substrate 10 is greater than the above range, layers or patterns formed on the center region (i.e., the non-etch region) of the substrate 10 may be exposed. The present invention is not limited thereto. Alternatively, the size of the mask part 300 may be equal to or greater than that of the substrate 10. Inert gas may be injected from an inner region of the mask part 300 to prevent etch gas which is converted to plasma from penetrating into the center region of the substrate toward the mask part 300.

The mask part 300 is disposed in the reaction compartment A inside the shield part 200. The mask part 300 is disposed at a bottom surface of the recess 123 (i.e., a lower surface of the upper wall of the upper chamber 120). The mask part 300 may be formed with separate members, and attached onto the bottom surface of the recess 123 using a coupling member. The present invention is not limited thereto, but the mask part 300 and the upper chamber 120 may be formed as a single body.

An upper electrode 310 may be disposed at an end portion of the mask part 300 as shown in the figure. A ground voltage is applied to the upper electrode 310. The present invention is not limited thereto, but the upper electrode 310 may be disposed inside the mask part 300. In addition, the mask part 300 may be used as the upper electrode. In this case, an insulation layer is formed on a side of the mask part 300. The upper electrode 310 is used to induce coupling of a bias voltage applied to the substrate support 500 to increase plasma density and, therefore, etch rate at the edge region of the substrate 10 is improved.

The plasma generator 400 includes an antenna part 410 and a power supply 420. The antenna part 410 is disposed in the separation compartment D surrounded by the shield part 200, the upper chamber 120, and the lower chamber 110. The antenna part 410 includes at least one coil, and the coil is provided to wind around the shield part 200 N times. The coil is wound around the shield part 200 twice according to the figures. The present invention is not limited thereto, but the number of winding may be increased. The coil may be overlapped, stacked or crossed vertically and/or horizontally. When a distance between the substrate 10 and the nearest antenna part 410 is approximately 2 cm to 10 cm, plasma can be efficiently generated at the edge region of the substrate 10. If the distance is shorter than 2 cm, plasma can be generated at the center region of the substrate 10, and thus the center region of the substrate 10 may be undesirably etched. If the distance is larger 10 cm, it is difficult to generate high-density plasma at the edge region of the substrate 10.

The power supply 420 supplies RF power to supply high-frequency power to the antenna part 410. The plasma supply 420 may be disposed outside the chamber 100. Only the antenna part 410 of the plasma generator 400 may be disposed in the separation compartment D of the chamber 100, and other components of the plasma generator 400 may be disposed outside the chamber 100. In the exemplary embodiment, since the antenna part 410 is disposed in the chamber, i.e., in the separation compartment D adjacent to the reaction compartment A, high-density plasma can be generated in the reaction compartment A adjacent to the antenna part 410. Plasma can be generated to have a ring shape in the reaction compartment A inside the ring-shaped shield part 200. The antenna part 410 can be formed integrally with the chamber 100 to simplify the plasma etching apparatus and reduce the size of the plasma etching apparatus. Power supplied from the power supply 420 may be in a range of approximately 100 W to 3.0 KW. The frequency of power supplied may be in a range of approximately 2 MHz to 13.56 MHz.

Plasma is generated in the reaction compartment A inside the shield part 200 in response to the plasma power (high frequency power) supplied to the antenna part 410. That is, high-density plasma is generated inside the shield part 200 by the antenna part 410. Since the mask part 300 is disposed inside the shield part 200, generation of plasma is concentrated in a region between the shield part 200 and the mask part 300, a region between the shield part 200 and the lifted substrate support 500.

As explained above in the exemplary embodiment, the antenna part 410 is disposed around the side of the substrate which is lifted by the substrate support 500, and ground electrodes are disposed at upper and lower sides of the antenna part 410 to generate uniform high-density plasma at the edge region of the substrate. Further, since the plasma can be concentrated in the edge region of the substrate 10, the edge region of the substrate 10 can be etched more efficiently.

The plasma generator 400 is not limited thereto, but may be a capacitively coupled plasma (CCP) generator, a hybrid type plasma generator, an electron cyclotron resonance (ECR) plasma generator, or a surface wave plasma (SWP) generator.

A predetermined connection hole (not shown) is formed at the upper chamber to connect the power supply 420 and the antenna part 410. The power supply 420 may be connected through the connection hole to the antenna part 410 disposed in the separation compartment D of the upper chamber 120. A reversed case is also possible. An impedance matching unit (not shown) may be further disposed between the power supply 420 and the antenna part 410. According to the exemplary embodiment, the heating units 112 and 122 are provided in the chamber 100 or at the side of the chamber 100. Therefore, a predetermined cooling unit (not shown) may be provided at a side of the antenna part 410 to prevent the antenna part 410 from being damaged by the heating units 112 and 122.

The Faraday shield 600 is disposed on an outer surface of the shield part 200 for concentrating plasma generated inside the shield part 200 onto the edge region of the substrate 10. In the exemplary embodiment, the Faraday shield 600 may be disposed between the shield part 200 and the antenna part 410. The Faraday shield 600 prevents the plasma from being concentrated to the coil disposed at the antenna part 410 using Faraday effect, so that plasma can be uniformly formed inside the chamber 100. Furthermore, the Faraday shield 600 prevents local deposition of etch byproducts and polymers at the position of the coil of the inner surface of the shield part 200, so that minimum amount of the etch byproducts and polymers can be uniformly accumulated in the entire inner surface of the process chamber 100. Therefore, the lifetime of the plasma etching apparatus can be increased, and particle formation due to irregular separation of impurities accumulated in the chamber during the process can be prevented.

Although not shown, the Faraday shield 600 may include a ring-shaped body and a plurality of slits formed in the body. The slit are provided in a longitudinal direction with respect to the upper wall of the chamber 100. The uniformity of plasma can be controlled by controlling the width and pitch of the slits. The Faraday shield 600 is connected to a ground point of the plasma etching apparatus to minimize an undesired voltage between the coil of the antenna and the plasma when plasma is generated, and to uniformly distribute the plasma throughout the entire surface of the shield part 200.

Although not shown, an insulation member can be disposed between the Faraday shield 600 and the antenna part 410. The Faraday shield 600 may be in contact with the outer side of the shield 600 and spaced apart by a predetermined distance from the coil of the antenna.

The substrate support 500 is disposed in the reaction compartment A of the chamber 100 and supports the substrate 10. The substrate support 500 is used to move the substrate 10 loaded into the lower chamber 110 to the recess 123 of the upper chamber 120 where the mask part 300 and the shield part 200 are disposed, or to move the substrate 10 lifted to the recess 123 down to the lower chamber 110.

The substrate support 500 includes a substrate support chuck 520 configured to support the substrate 10, a driving unit 540 configured to move up and down the substrate support chuck 520, and a bias power supply 550 configured to supply bias power to the substrate support chuck 520. The substrate support 500 further includes a lift pin (not shown), and a predetermined through hole, through which the lift pin moves up and down, is provided in the substrate support chuck.

The substrate support chuck 520 has a plate shape similar to the substrate 10. The substrate support chuck 520 is manufactured as plate shape of which size is smaller than that of the substrate 10. Therefore, when the substrate 10 is placed on the substrate support chuck 520, a lower edge region can be exposed to a plasma generating region. A substrate heating unit 530 is disposed inside the substrate support chuck 520 for heating the substrate chuck 520. The substrate heating unit 530 includes a hot wire 531 disposed inside the substrate support chuck 520, and a hot wire power supply 532 supplying power to the hot wire 531. The hot wire 531 of the substrate heating unit 530 may be concentrated in an edge region of the substrate support chuck 520. The edge region of the substrate 10 placed on the substrate support chuck 520 can be heated, and thus the reactivity of the edge region of the substrate 10 can be improved. The heating temperature of the substrate heating unit 530 may be in a range of approximately 150° C. to 550° C. In the exemplary embodiment, the substrate support chuck may be heated to around approximately 350° C.

The power supplied from the bias power supply 550 may be in a range of approximately 10 W to 1000 W. And the frequency of the bias power supply may be in a range of approximately 2 MHz to 13.56 MHz. The bias power supply 550 supplies bias power to the substrate support chuck 520 whereby the bias power is provided to the substrate 10 placed on the substrate support chuck 520. Owing to the bias power, plasma can be moved to the edge region of the substrate 10 exposed outside the substrate support chuck 520 and the mask part 300.

The lower electrode 510 may be disposed on an edge portion of the substrate support chuck 520 as shown in the figure. The lower electrode 510 is grounded. The lower electrode 510 is used to induce coupling of the bias power supplied to the substrate support 500 to increase plasma density and improve etch rate at the edge region of the substrate 10.

Since bias power is supplied to the substrate support chuck 520, an insulation layer 511 is disposed between the substrate support chuck 520 and the lower electrode 510. According to FIG. 1, the insulation layer 511 is disposed along a circumference of a side of the substrate support chuck 520. In this case, the size of the substrate support 500 includes the substrate support chuck 520 and the insulation layer 511. Therefore, when the substrate 10 is placed on the substrate support 500, the substrate 10 protrudes from an end of the insulation layer 511 by approximately 0.1 mm to 5 mm. However, when the insulation layer 511 is disposed only between the substrate support chuck 520 and the lower electrode 510, that is, when the insulation layer 511 does not make contact with the substrate 10, the substrate 10 may protrude from an end of the substrate support chuck 520 by approximately 0.1 mm to 5 mm. As shown in FIG. 5, the lower electrode 510 at the side of the substrate support chuck 520 may be omitted, and in this case, the insulation layer 511 may be also omitted.

The driving unit 540 includes a driving shaft 541 which is extended into the chamber 100 to move the substrate support chuck 520 up and down, and a driving member 542 which moves the driving shaft 541.

The plasma etching apparatus further includes a gas supply unit 700 which supplies process gas to a plasma generating region (i.e., a region among the shield part 200, the mask part 300, and the substrate support 500). The gas supply unit 700 includes a injector 710 injecting the process gas into the reaction compartment A of the chamber 100, a gas pipe 720 supplying the process gas to the injector 710, and a gas tank 730 supplying the process gas to the gas pipe 720. The injector 710 may include a plurality of nozzles disposed in the upper chamber 120 around the periphery of the mask part 300. Therefore, the process gas can be uniformly supplied to the periphery of the mask part 300. As described above, the heating units 112 and 122 are disposed in the chamber 100. Before the process gas is injected into the chamber 100, the process gas can be heated using the heating units 112 and 122.

The gas supply unit 700 is not limited thereto but may be varied in different forms. For example, as shown in FIG. 5 illustrating a variant, the gas supply unit 700 may be provided into the shield part through the shield part 200. That is, a plurality of injectors 710 may be uniformly formed in the shield part 200, and the gas pipe 720 may be extended through the upper chamber 120 so as to supply the process gas to the inner region of the shield part 200, i.e., the plasma generating region.

An etch method using the above-described plasma etching apparatus will now be described.

The gate valve 130 disposed on the sidewall of the chamber 100 is opened, and a substrate 10 is loaded into the chamber 100, i.e., the reaction compartment A. The loaded substrate is placed on the substrate support 500. The inside of the chamber 100 may be heated up to a predetermined temperature using the heating units 112, 122 and 530 provided in the substrate support and the chamber, and may be heated up simultaneously with loading of the substrate 10. In particular, the edge region of the substrate 10 is heated to improve the etch-reactivity of the edge region of the substrate 10.

After the substrate 10 is located on the substrate support 500, the gate valve 130 is closed, and the pressure of the reaction compartment A of the chamber 100 is adjusted to a desired level. The pressure of the reaction compartment A may be $1\times10^{-3}$ torr or less. Next, the substrate support 500 is moved upward into the recess 123 of the upper chamber 120. The substrate support 500 is placed to be adjacent to the mask part 300 disposed in the recess 123. The distance between the substrate support 500 and the mask part 300 is adjusted to be in a range of approximately 0.1 mm to 10 mm. In the range, generation of plasma can be prevented between the mask part 300 and the substrate support 500. Further, the substrate 10, the substrate support 500, and the mask part 300 are formed in a circular shape, and concentrically aligned. The edge region of the substrate 10 is exposed outside the closely spaced substrate support 500 and mask part 300. When the mask part 300 is adjacent to the substrate 10, plasma is not generated in a region of the substrate 10 under the mask part 300.

Thereafter, process gas is supplied from the gas supply unit 700 to the reaction compartment A, and plasma is generated in the reaction compartment A into which the process gas is supplied using the plasma generator 400. That is, the process gas is transformed into plasma. Here, the process pressure may be kept in a range of approximately 5 mTorr to 500 mTorr.

A high-frequency voltage is applied to the antenna part 410 disposed in the outer region of the shield part 200, i.e., the separation compartment D, and a ground voltage is applied to the upper electrode 310 disposed on a side of the mask part 300 and to the lower electrode 510 disposed on a side of the substrate support 500. Then, plasma is generated in a region among the antenna part 410, the upper electrode 310, and the lower electrode 510, i.e., inner region of the shield part 200. For example, high-frequency power having a frequency of 2 MHz and a power of 1.5 KW power is supplied to the antenna part 410 to generate plasma on the edge region of the substrate 10.

That is, the process gas is uniformly supplied along the periphery of the mask part 300 and activated by plasma. Owing to the Faraday shield 600 disposed on the outer surface of the shield part 200, the process gas converted to plasma is concentrated onto the edge region of the substrate 10. Then, a bias voltage is applied to the upper electrode 310 disposed around the mask part 300 and the lower electrode 510 disposed around the substrate support 500 in order to remove unnecessary layers and particles from the edge region of the substrate 10. For example, bias power having a frequency of 13.56 MHz and a power of 500 W is supplied to the substrate support 500 to etch away unnecessary layers and particles from the edge region of the substrate 10 exposed to the plasma. In the exemplary embodiment, even when a metal layer is deposited in the edge region of the substrate 10, the metal layer deposited on the substrate can be heated using the heating units disposed in the chamber 100 or on the sidewall of the chamber 100 and the substrate heating unit disposed in the substrate support 500. In this way, the edge region of the substrate is etched by the activated plasma and the metal layer can be removed.

After etching of the edge region of the substrate 10 is completed, plasma generation and supply of the process gas are stopped, and remaining gas is discharged from the chamber 100. The substrate support 500 is moved down to a lower wall region of the lower chamber 110. Here, required gas may be supplied into the chamber 100 depending on situation, and high-frequency power used for antenna and bias may be gradually reduced to maintain plasma until the remaining gas is completely discharged or the substrate support 500 is moved down, so that the plasma can be gradually extinguished. In this way, defects and particle generation may be reduced. Thereafter, the gate valve 130 is opened, and the substrate 10 is carried out of the chamber 100.

The present invention is not limited to the above description, but may be changed into various forms.

A plasma etching apparatus in accordance with a second exemplary embodiment of the present invention will be described hereafter. In the following descriptions, overlapping portions with the above-described first embodiment will be skipped. Some of the following descriptions can be applied to the above-described first embodiment.

Figure 6:
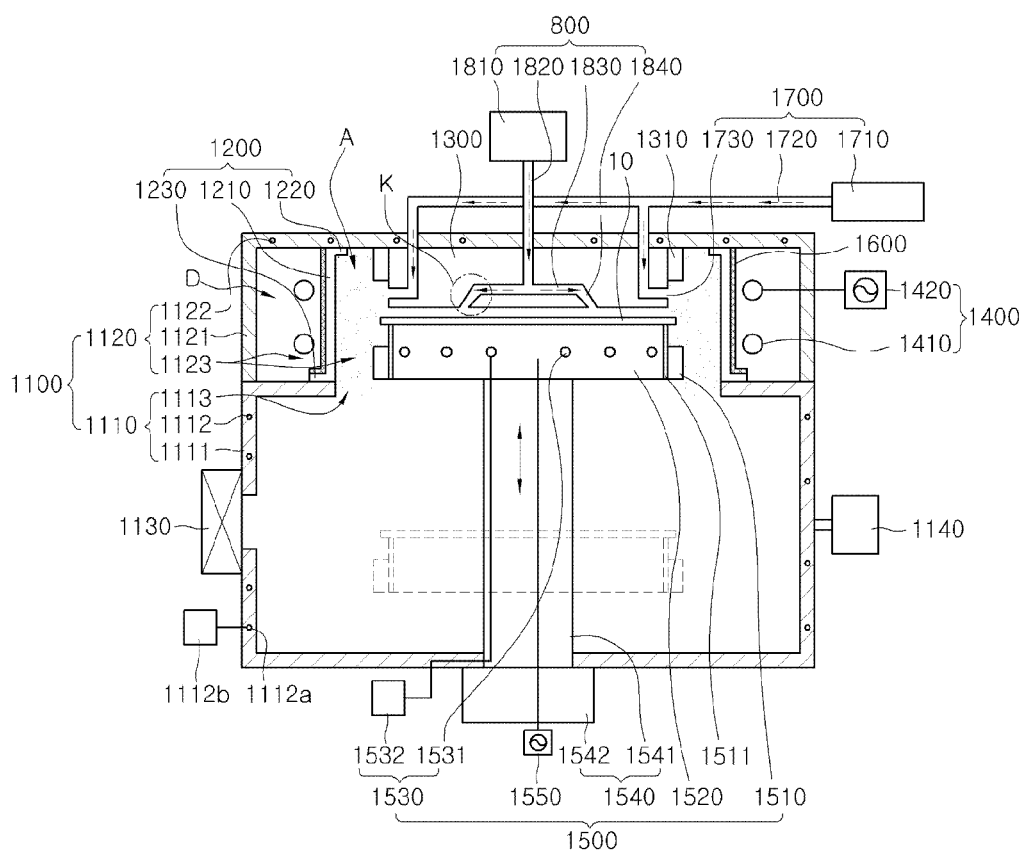
FIG. 6 is a schematic cross-sectional view illustrating an apparatus for etching a substrate edge in accordance with a second exemplary embodiment.
Figure 7:
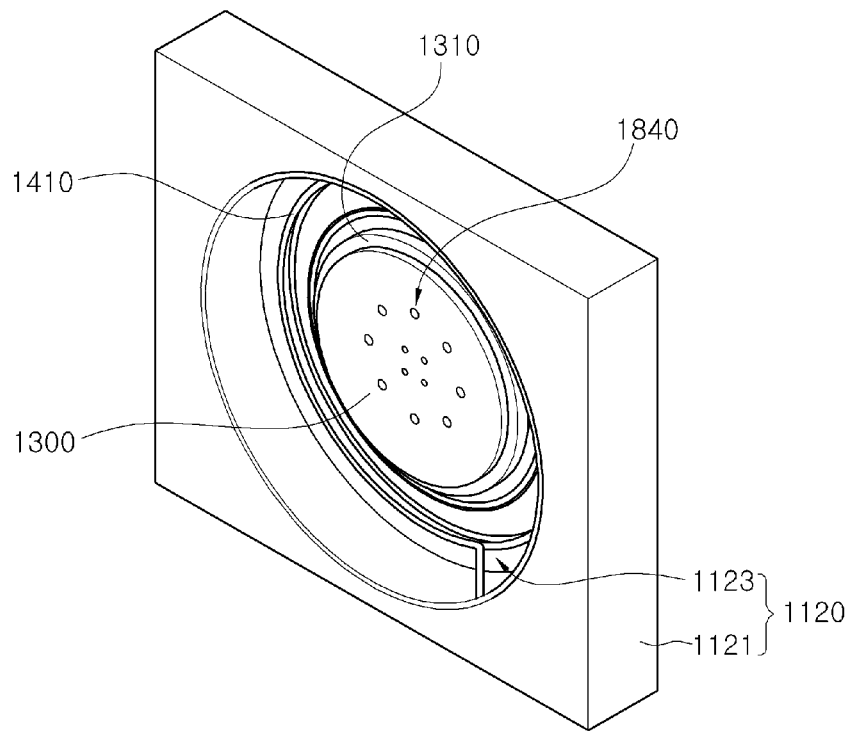
FIG. 7 is a perspective view illustrating an upper chamber in accordance with the second exemplary embodiment.
Figure 8:
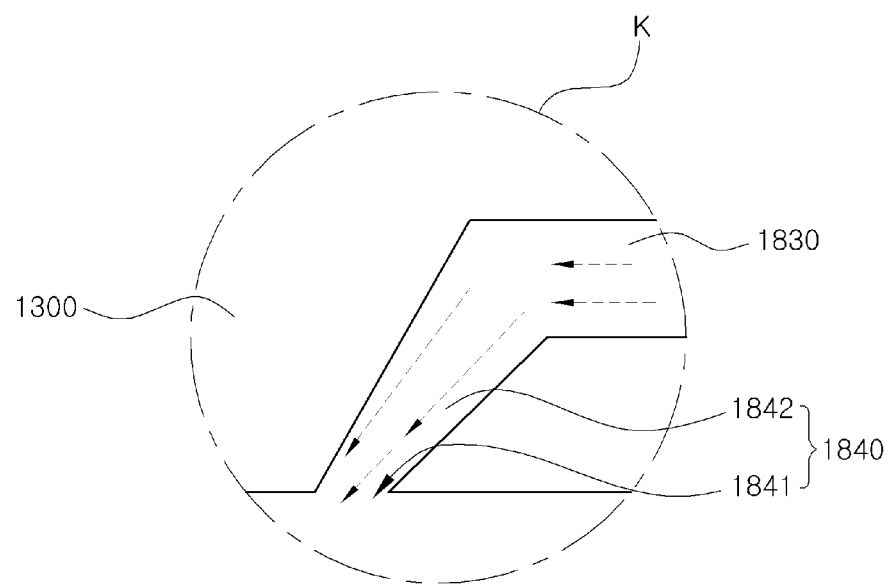
FIG. 8 is an enlarged view of portion K of FIG. 6.

FIG. 6 is a schematic cross-sectional view illustrating an apparatus for etching a substrate edge in accordance with a second exemplary embodiment. FIG. 7 is a perspective view illustrating an upper chamber in accordance with the second exemplary embodiment. FIG. 8 is an enlarged view of portion K of FIG. 6.

Referring to FIGS. 6 through 8, the substrate edge etching apparatus includes a chamber 1100, a shield part 1200 dividing an inside of the chamber into a reaction compartment A and a separation compartment D, a mask part 1300 disposed in the reaction compartment A in the shield part 1200, a plasma generator 1400 disposed in the separation compartment D in the outer region of the shield part 1200, a substrate support 1500 disposed under the mask part 1300, and a Faraday shield 1600 disposed between the mask part 1300 and the plasma generator 1400. A center region of a substrate 10 is screened by the mask part 1300 and the substrate support 1500, and an edge region of the substrate 10 is exposed. The substrate edge etching apparatus includes a process gas supply unit 1700 for supplying process gas to the reaction compartment A. i.e., the edge region of the substrate, in the shield part 1200 through the mask part 1300, and an inert gas supply unit 1800 for supplying inert gas to the center region of the substrate 10 under the mask part 1300 through the mask part 1300.

The chamber 1100 includes a lower chamber 1110 and an upper chamber 1120 having heating units 1112 and 1122.

The present invention is not limited thereto, but the chamber 1100 may be formed as a single body. That is, the chamber 1100 may be formed of a hollow polyhedron or cylinder.

In the exemplary embodiment, the etching apparatus includes the shield part 1200 dividing the chamber 1100 is divided into the reaction compartment A and the separation compartment D. The shield part 1200 will now be described hereafter.

In the exemplary embodiment, after lifting the substrate 10 to the inner region of the shield part 1200 using the substrate support 1500, the edge region of the substrate 10 can be etched by forming plasma in the inner region of the shield part 1200, i.e., a region between the shield part 1200 and the substrate support 1500. In the above description, the shield part 1200 is manufactured separately from the upper and lower chambers 1110 and 1120. However, the shield part 1200 may be manufactured as a single body with the upper and lower chambers 1110 and 1120.

When the chamber 1100 is manufactured as a single body, the shield part 1200 includes an extension plate portion extending from an upper wall of the chamber 1100 and a protrusion plate portion extending from the extension plate portion toward a sidewall of the chamber 1100. That is, the shield part 1200 has an L-shaped cross section. In this way, a separation compartment D is formed by the shield part 1200 and portions of the upper wall and sidewall. A substrate 10 is moved up to an inner region of the extension plate portion of the shield part 1200. An antenna is disposed at an outer side of the extension plate portion to generate plasma in the inner region of the shield part 1200, thereby layers and particles deposited in an edge region of the substrate 10 can be removed.

In the exemplary embodiment, the etching apparatus includes the mask part 1300 for protecting the non-etch region of the substrate 10 as described above.

In the exemplary embodiment, as described above, the etching apparatus includes the plasma generator 1400 for generating plasma in the reaction compartment A of the chamber 1100. The plasma generator 1400 will now be described hereafter.

In the exemplary embodiment, as described above, the etching apparatus includes the Faraday shield 1600 for concentrating plasma onto the edge region of the substrate 10. The Faraday shield 1600 will now be described hereafter.

In the exemplary embodiment, as explained above, the etching apparatus includes the substrate support 1500 for supporting the substrate 10. The substrate support 1500 will now be described hereafter.

The substrate support 1500 includes a substrate support chuck 1520 configured to support the substrate 10, a driving unit 1540 configured to move up and down the substrate support chuck 1520, and a bias power supply 1550 configured to supply bias power to the substrate support chuck 1520. The substrate support 1500 further includes a lift pin (not shown), and a predetermined through hole, through which the lift pin moves up and down, is provided in the substrate support chuck.

In the exemplary embodiment, as explained above, the etching apparatus includes the process gas supply unit 1700 which supplies process gas to a plasma generating region of the reaction compartment A (i.e., a region among the shield part 1200, the mask part 1300, and the substrate support 1500). The process gas supply unit 1700 will now be described hereafter.

The process gas supply unit 1700 includes an injector 1730 injecting process gas into the reaction compartment A of the chamber 1100, a gas pipe 1720 supplying the process gas to the injector 1730, and a gas tank 1710 supplying the process gas to the gas pipe 1720.

The injector 1730 may include a plurality of nozzles disposed in the upper chamber 1120 around the periphery of the mask part 1300. Therefore, the process gas can be uniformly supplied to the periphery of the mask part 1300.

For this, the gas pipe 1720 extends to an inner region of the mask part 1300 through the upper chamber 1120 as shown in FIG. 1. Both ends of the gas pipe 1720 are connected to the injector 1730 and the gas tank 1710, respectively. As shown in the figure, the gas pipe 1720 may have a plurality of branch lines.

In the exemplary embodiment, the heating units 1112 and 1122 are disposed in the chamber 1100. Before the process gas is injected, the process gas can be heated by heating a portion of the gas pipe 1720 extending through the upper chamber 1120.

In the exemplary embodiment, as explained above, the etching apparatus includes the inert gas supply unit 1800 for supplying inert gas to the non-etch region of the substrate 10. The inert gas supply unit 1800 will now be described hereafter.

The inert gas supply unit 1800 is disposed through the mask part 1300, and supplies inert gas to the center region of the substrate 10 disposed under the mask part 1300. As such, the process gas is prevented from penetrating toward the center region of the substrate 10 and, therefore, the center region of the substrate can be prevented from being etched during etch process of the edge region of the substrate. That is, if inert gas is supplied to the center region of the substrate 10, the pressure of the center region of the substrate 10 becomes relatively higher than that of the edge region of the substrate 10, so that the inert gas flows from the center region of the substrate to the edge region of the substrate. Such a flow of inert gas prevents the process gas from penetrating toward the center region of the substrate.

As shown in FIG. 6, the inert gas supply unit 1800 includes an inert gas tank 1810 in which inert gas is stored, an injection nozzle part 1840 disposed in a bottom surface of the mask part 1300, and an inert gas passage supplying the inert gas to the injection nozzle part 1840. Argon (Ar), nitrogen ($N_2$) or the like may be used as the inert gas.

The inert gas passage includes an extension passage 1820 extending from the inert gas tank 1810 to an inner area of the mask part 1300 through the chamber 1100, and a plurality of branch passages 1830 which is branched from the extension passage 1820 and is connected to the injection nozzle part 1840.

The extension passage 1820 extends in an approximately perpendicular direction with respect to a contact surface of the chamber 1100 and the mask part 1300. A through hole through which the extension passage 1820 passes is provided in the chamber 1100. In FIG. 6, a single extension passage 1820 is illustrated to extend through an inner side of the mask part 1300. The present invention is not limited thereto, but a plurality of extension passages 1820 may extend through the inner side of the mask part 1300. The plurality of branch passages 1830 include a plurality of passages radially branching from an end of the extension passage 1820. Extension length of the plurality of branch passages 1830 may be the same. The branch passages 1830 extend in an approximately perpendicular direction to the extension passage 1820. That is, the branch passages 1830 extend in an approximately parallel direction with a bottom surface of the mask part 1300. Although the inert gas passage is illustrated as straight lines in FIG. 6, the present invention is not limited thereto, but the inert gas passage may be formed to have curved lines or oblique lines.

The injection nozzle part 1840 is manufactured to have a hole shape extending from the inert gas passage to the bottom surface (that is, a surface facing the substrate 10) of the mask part 1300. Therefore, inert gas supplied from the inert gas passage can be injected to a region under the bottom surface of the mask part 1300 (i.e., a region between the mask part 1300 and the substrate 10).

The injection nozzle part 1840 may be provided in plurality at the bottom surface of the mask part 1300. Further, a curve formed by connecting ends of outermost injection nozzles parts 1840 may be a circular shape. The present invention is not limited thereto, but the curve formed by connecting ends of the injection nozzle parts 1840 may be varied variously depending on the shape of the substrate 10. In this way, inert gas supplied by the injection nozzle parts 1840 can be uniformly injected to the center region of the substrate 10.

As shown in FIG. 7, four injection nozzle parts 1840 are disposed in an inner region to be adjacent to a center of the mask part 1300, and six injection nozzle parts 1840 are disposed in an outer region approximately in a circular shape. The number of the injection nozzle parts 1840 is not limited thereto, but may be more or less than that. In FIG. 7, the injection nozzle part 1840 has a circular hole shape. The present invention is not limited thereto, but the injection nozzle part 1840 may have a slit shape. Further, the injection nozzle part 1840 may be uniformed arranged in the bottom surface of the mask part 1300.

The injection nozzle part 1840 includes an injection hole 1841 and a nozzle passage 1842. As shown in FIG. 8, the nozzle passage 1842 may be manufactured so that the diameter is tapered toward the injection hole 1841. The nozzle passage 1842 may be manufactured to be inclined at a predetermined angle with respect to the bottom surface of the mask part 1300. In this way, inert gas can be injected from the center region of the substrate 10 to the edge region of the substrate 10.

The present invention is not limited to the above description, but may be changed in various forms. That is, a baffle may be disposed inside a mask part integrated with a gas supply unit to uniformly supply the inert gas. In the following descriptions, overlapping portions with the above-described first embodiment will be skipped. Variants of the etching apparatus in accordance with the second exemplary embodiment will be described hereafter.

Figure 9:
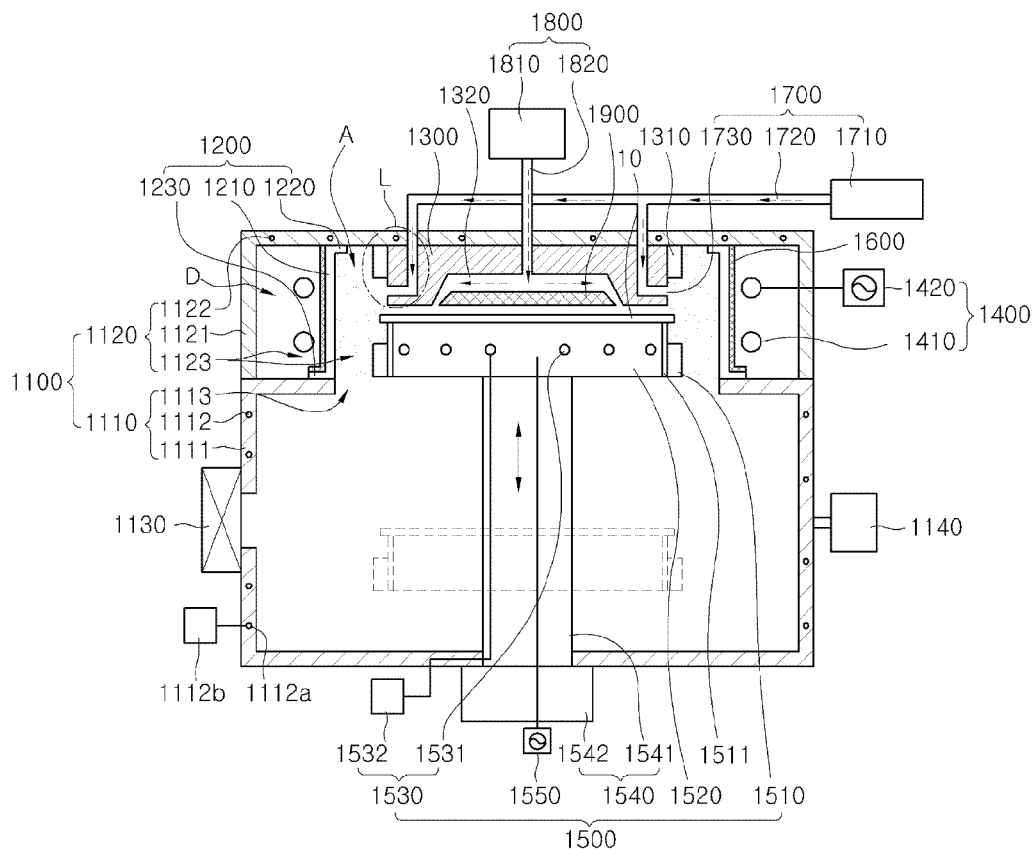
FIG. 9 is a schematic cross-sectional view illustrating an apparatus for etching a substrate edge in accordance with a variant of the second exemplary embodiment.
Figure 10:
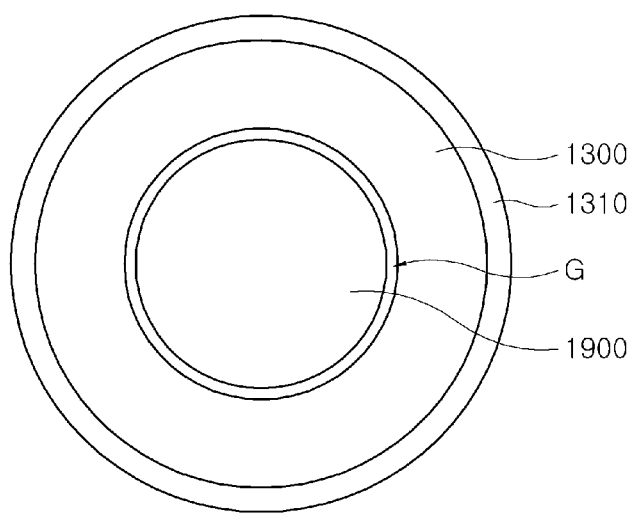
FIG. 10 is a bottom view illustrating a mask part in accordance with a variant of the second exemplary embodiment.
Figure 11:
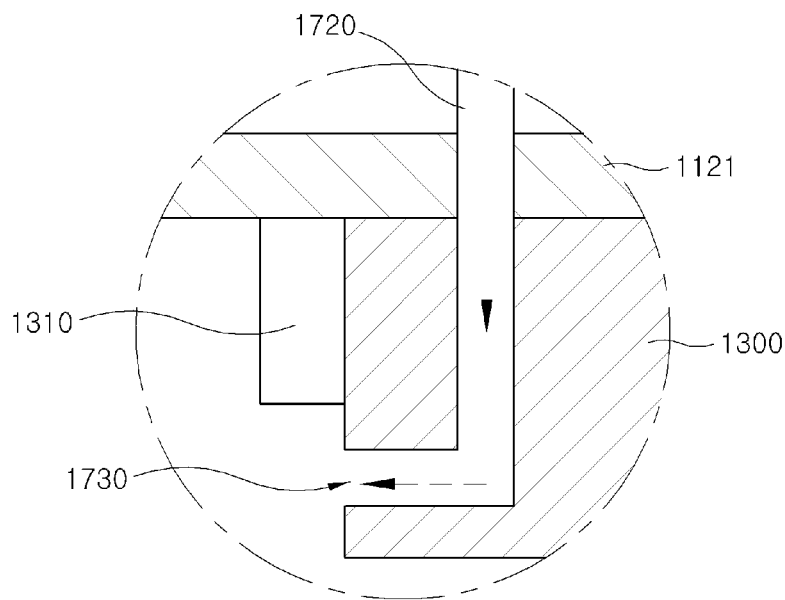
FIG. 11 is an enlarged view of portion L of FIG. 9.
Figure 12:
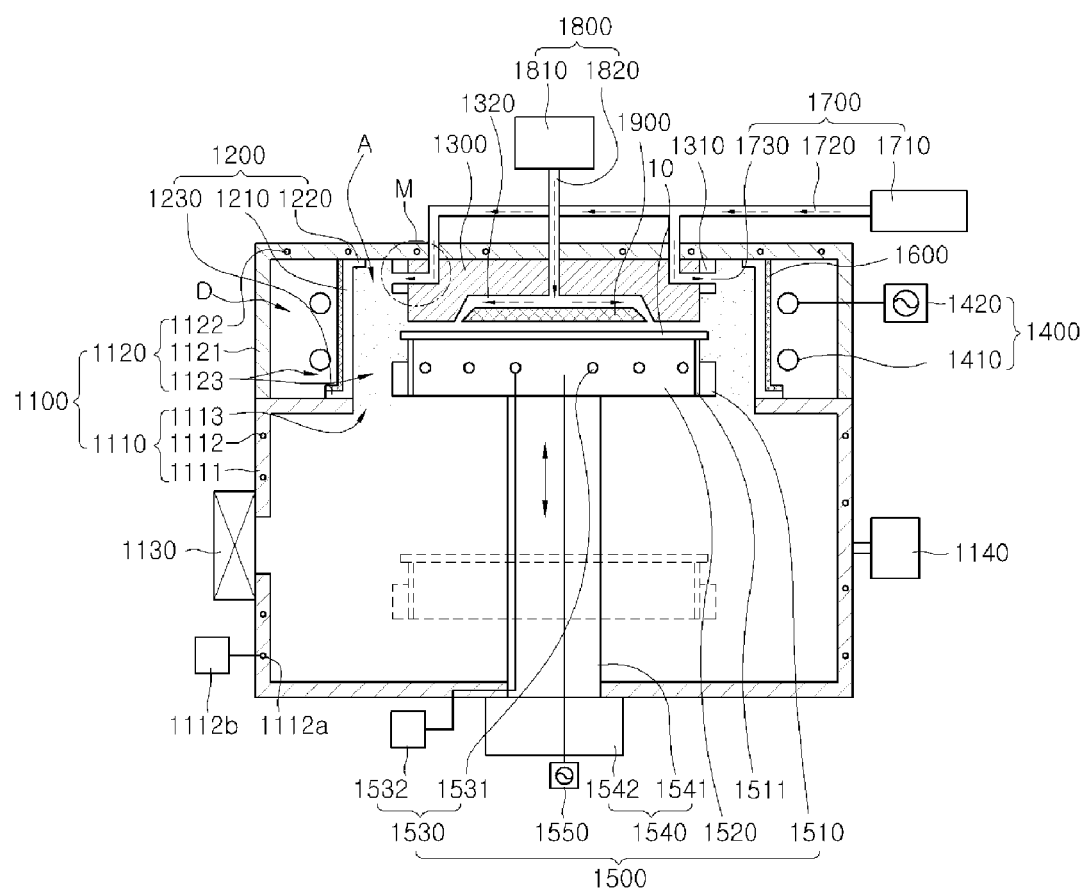
FIGS. 12 and 13 are schematic cross-sectional views illustrating variants of the apparatus for etching the substrate edge in accordance with the second exemplary embodiments.
Figure 13:
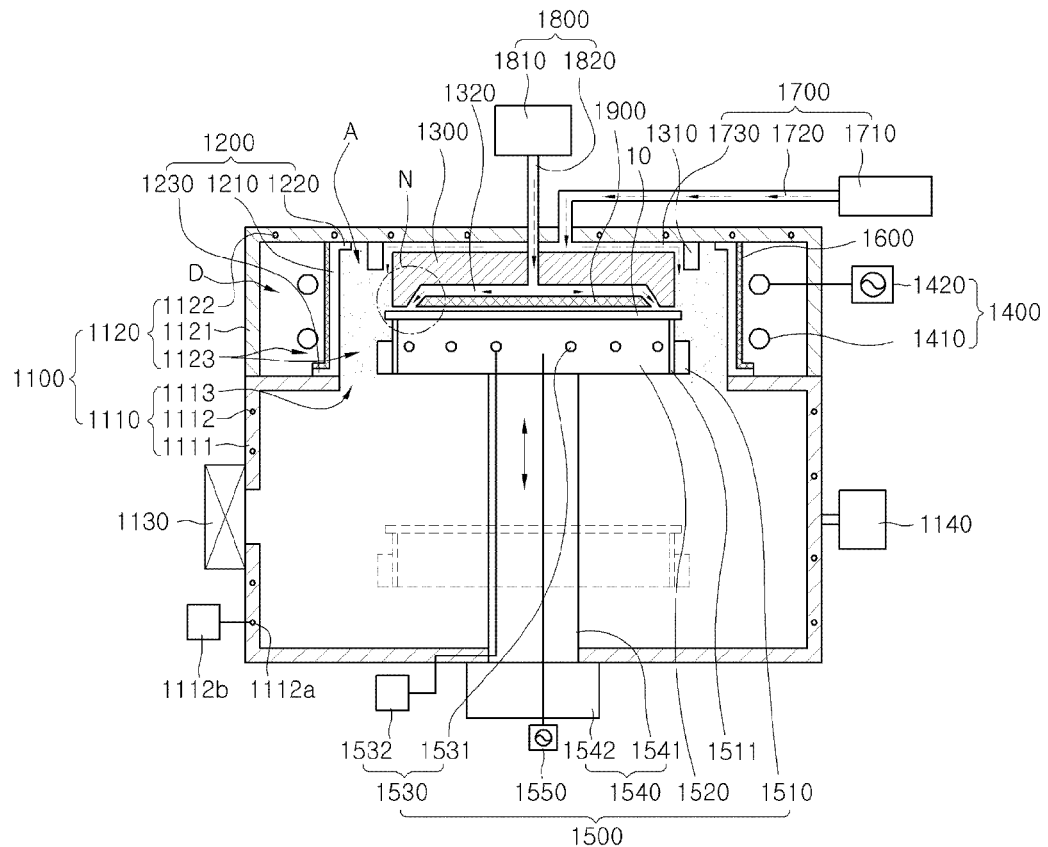
Figure 14:
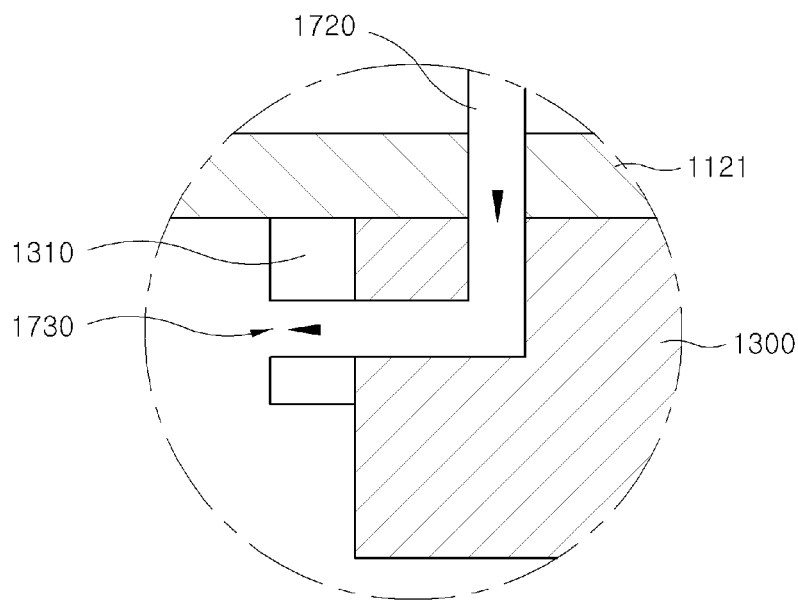
FIG. 14 through 16 are cross-sectional views for explaining portion M of FIG. 12.
Figure 15:
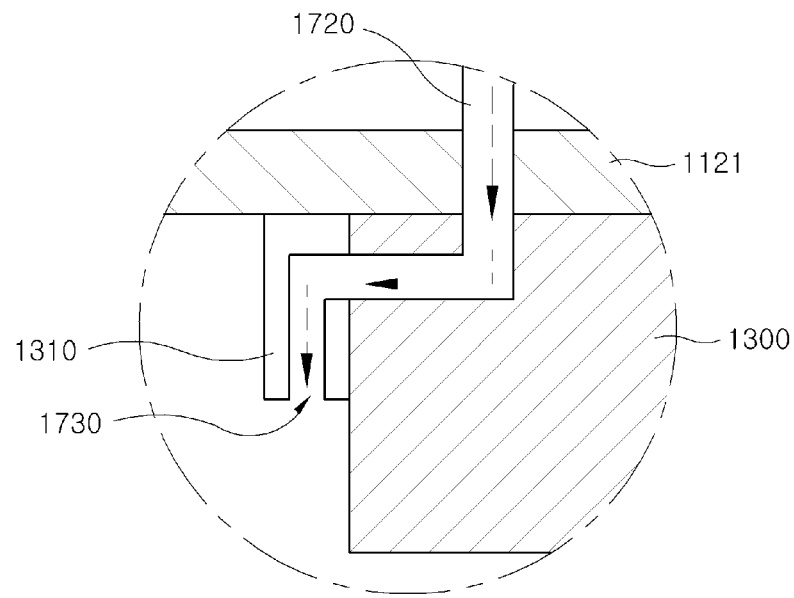
Figure 16:
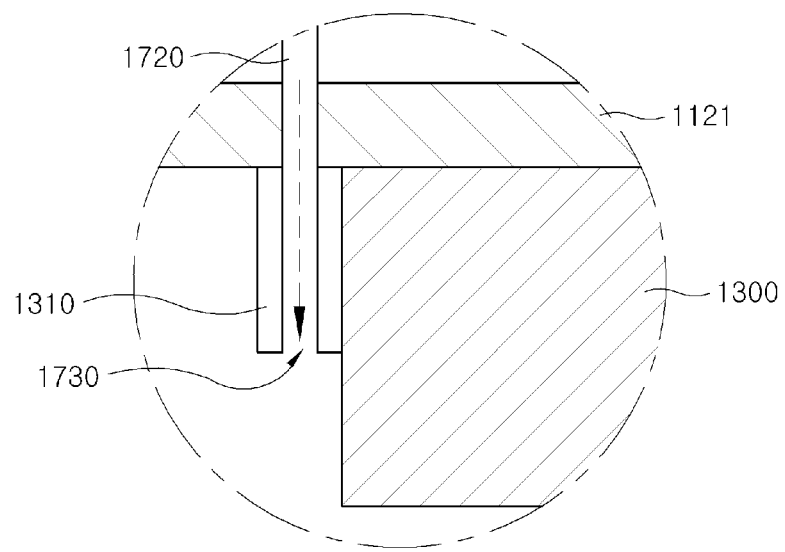
Figure 17:
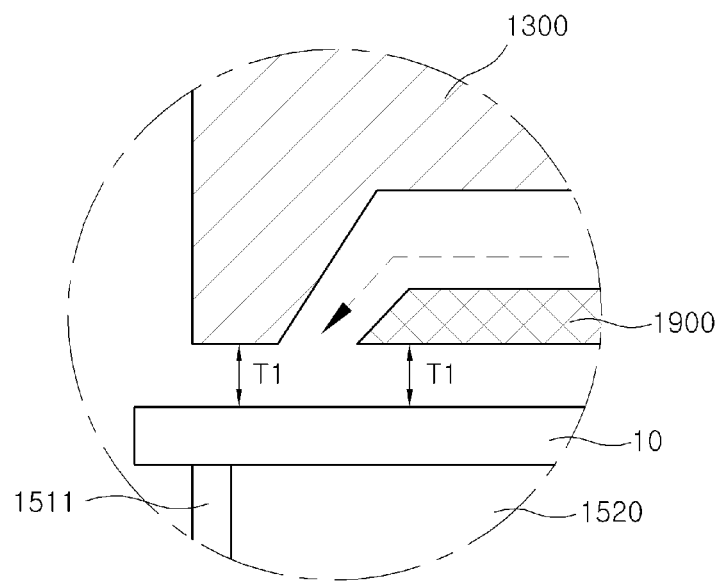
FIGS. 17 and 18 are cross-sectional views for explaining portion N of FIG. 13.
Figure 18:
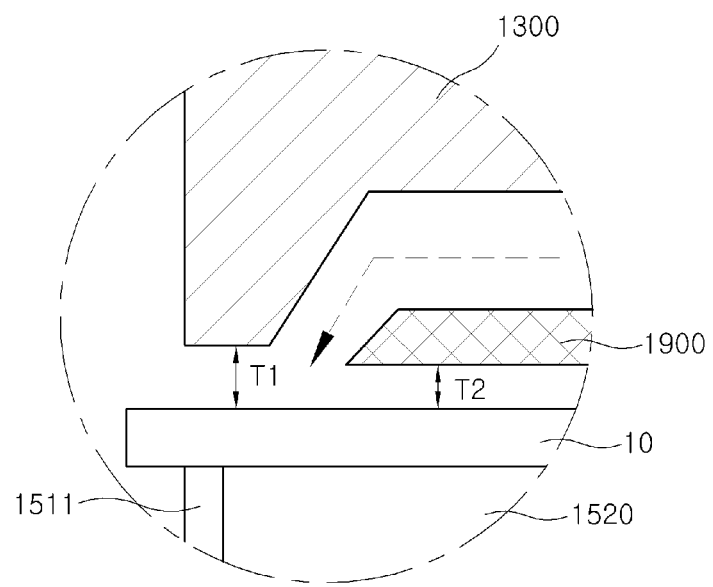

FIG. 9 is a schematic cross-sectional view illustrating an apparatus for etching a substrate edge in accordance with a variant of the second exemplary embodiment. FIG. 10 is a bottom view illustrating a mask part in accordance with a variant of the second exemplary embodiment. FIG. 11 is an enlarged view of portion L of FIG. 9. FIGS. 12 and 13 are schematic cross-sectional views illustrating variants of the apparatus for etching the substrate edge in accordance with the second exemplary embodiments. FIG. 14 through 16 are cross-sectional views for explaining portion M of FIG. 12. FIGS. 17 and 18 are cross-sectional views for explaining portion N of FIG. 13.

Referring to FIGS. 9 through 18, the substrate edge etching apparatus of the current embodiment includes a chamber 1100, a substrate support 1500 for supporting a substrate 10, a mask part 1300 which is disposed in an upper region of the chamber to cover a non-etch region of the substrate 10 and has a recess 1320, a baffle 1900 disposed in the recess 1320, an inert gas supply unit 1800 for supplying inert gas to the baffle 1900, a plasma generator 1400 for generating plasma at an edge region of the substrate 10, and a process gas supply unit 1700 for supplying process gas to the edge region of the substrate 10.

In the exemplary embodiment, the recess 1320 of the mask part 1300 is formed to be recessed from a bottom surface of the mask part 1300 toward the inside thereof. An opening of the recess 1320 has a circular shape. An inert gas passage is provided at an upper surface of the recess 1320.

The baffle 1900 is disposed under the inert gas passage so that inert gas supplied through the inert gas passage is bumped against the baffle 1900, whereby the inert gas is widely spread and is uniformed injected.

For this, the baffle 1900 is disposed at a region of the opening of the recess 1320 as shown in FIG. 9. The baffle 1900 is manufactured to have a circular plate shape as shown in FIG. 10. In this case, the diameter of the baffle 1900 may be smaller than that of the recess 1320. That is, a groove through which the inert gas can be discharged is provided between the baffle 1900 and the recess 1320 (See G in FIG. 10). The groove is illustrated to have a circular ring shape. The present invention is not limited thereto, but a plurality of slits or through holes may be arranged in a ring shape. The baffle 1900 may be manufactured to have an oblique sidewall, so that inert gas which is discharged along the sidewall of the baffle can be injected at a predetermined angle and not perpendicularly to the surface of the substrate 10. Thus, the inert gas can be injected to a direction of the edge region of the substrate.

As shown in FIG. 13, the baffle 1900 may extend to a region adjacent to the edge region of the substrate 10. In this way, inert gas is applied to a region adjacent to the edge region of the substrate, and can be prevented from penetrating toward the center region of the substrate (i.e., non-etch region).

In the exemplary embodiment, the baffle 1900 may be used to cover an upper side of the non-etch region. As shown in FIGS. 9, 12, and 13, the baffle 1900 is disposed on the bottom of the mask part 1300. As shown in FIG. 17, a gap (T1) between the mask part 1300 and the substrate 10 may be adjusted to be the same as a gap (T1) between the baffle 1900 and the substrate 10, and as shown in FIG. 18, a gap (T2) between the baffle 1900 and the substrate 10 may be adjusted to be smaller that the gap (T1) between the mask part 1300 and the substrate 10 by controlling a height of the baffle 1900. In this way, the baffle 1900 is disposed adjacent to the substrate 10 to prevent generation of plasma between the baffle 1900 and the substrate 10. Therefore, the center region of the substrate 10 can be prevented from being damaged. In addition, by decreasing the distance between the baffle 1900 and the substrate 10, penetration of impurities into a space between the baffle 1900 and the substrate 10 can be prevented while the edge region of the substrate 10 is etched. Alternatively, the distance between the baffle 1900 and the substrate 10 may be greater than the distance between the mask part 1300 and the substrate 10.

The process gas supply unit 1700 in accordance with the exemplary embodiment includes, as shown in FIG. 11, an injector 1730 disposed in a sidewall of the mask part 1300, and a gas pipe 1720 connected to the injector 1730 through the chamber 1100 and the mask part 1300. The injector 1730 is disposed under an upper electrode 1310. The present invention is not limited thereto, but the injector 1730 may be disposed in a lateral side of the upper electrode 1310, and the gas pipe 1720 can be connected to the injector 1730 through the chamber 1100, the mask part 1300, and the upper electrode 1310 as shown in FIG. 14. In this way, process gas can be injected toward the lateral side of the upper electrode 1310. Further, as shown in FIG. 15, the injector 1730 can be disposed in a lower side of the upper electrode 1310, and the gas pipe 1720 can be bent in the upper electrode 1310 to communicate with the injector 1730. In this way, process gas can be injected to the lower side of the upper electrode 1310, i.e., to the edge region of the substrate 10. In addition, as shown in FIG. 16 the injector 1730 can be disposed in the lower side of the upper electrode 1310, and the gas pipe 1720 can communicate with the injector 1730 through the chamber 1100 and the upper electrode 1310. That is, the gas pipe 1720 may not pass through the mask part 1300.

As shown in FIG. 13 illustrating a variant, a gas passage 1740 is disposed in a region between the chamber 1100 and the mask part 1300, and process gas is injected to a reaction compartment A through a gap between the mask part 1300 and the upper electrode 1310. The gas passage 1740 may be manufactured by extending the gas pipe 1720 to a region between the chamber 1100 and the mask part 1300. Alternatively, the gas passage 1740 can be manufactured by spacing the mask part 1300 away from the chamber 1100. Alternatively, the gas passage 1740 may be manufactured by cutting out portions of the chamber 1100 and/or the mask part 1300. In this way, the inner space of the chamber 1100 can be sufficiently used.

Process gas transported through the gas passage 1740 is injected into a space between the mask part 1300 and the upper electrode 1310. Here, the upper electrode 1310 guides the process gas injected in a direction of a lateral side of the mask part 1300 (i.e., in a direction parallel with the substrate 10) toward a perpendicular direction (i.e., a substrate direction), and supplies the process gas to the edge region of the substrate. The space between the mask part 1300 and the upper electrode 1310 can be formed by spacing the mask part 1300 and the upper electrode 1310 apart from each other, inserting a pipe into a space between the mask part 1300 and the upper electrode 1310, or cutting out portions of the mask part 1300 and/or the upper electrode 1310. The gas passage 1740 can have various configurations as described above in FIGS. 14 through 16. That is, the gas passage 740 can be provided through the upper electrode 1310, and can be extended to a space between the substrate 10 and the upper electrode 1310.

Although not shown, the mask part 1300 can be manufactured as a single body with a showerhead. For example, an inner space including the above-described baffle 1900 may be provided inside the mask part 1300, and a plurality of injection nozzles can be provided in a bottom surface of the inner surface, so that inert gas is uniformly injected to the center region of the substrate under the mask part 1300.

An exemplary etching method using the substrate edge etching apparatus in accordance with the first exemplary embodiment will now be briefly described as follows.

The gate valve 1130 disposed on the sidewall of the chamber 1100 is opened, and a substrate 10 is loaded into the chamber 1100, i.e., the reaction compartment A. The loaded substrate 10 is placed on the substrate support 1500. The inside of the chamber 1100 may be heated up to a predetermined temperature using the heating units 1112, 1122 and 1530 provided in the substrate support and the chamber, and may be heated up simultaneously with loading of the substrate 10. In particular, the edge region of the substrate 10 is heated to improve the etch-reactivity of the edge region of the substrate 10.

After the substrate 10 is located on the substrate support 1500, the gate valve 1130 is closed, and the pressure of the reaction compartment A of the chamber 1100 is adjusted to a desired level.

Next, the substrate support 1500 is moved upward into the recess 1123 of the upper chamber 1120. The substrate support 1500 is placed to be adjacent to the mask part 1300 disposed in the recess 1123. The distance between the substrate support 1500 and the mask part 1300 is adjusted to be in a range of approximately 0.1 mm to 10 mm. In the range, generation of plasma can be prevented between the mask part 1300 and the substrate support 1500. Further, the substrate 10, the substrate support 1500, and the mask part 1300 are formed in a circular shape, and concentrically aligned. The edge region of the substrate 10 is exposed outside the closely spaced substrate support 1500 and mask part 1300. When the mask part 1300 is adjacent to the substrate 10, plasma is not generated in a region of the substrate 10 under the mask part 1300.

Thereafter, process gas is supplied from the process gas supply unit 1700 to the reaction compartment A, and inert gas is supplied from the inert gas supply unit 1800 to a region between the substrate 10 and the mask part 1300 (i.e., the non-etch region of the substrate 10). Then, the plasma generator 1400 generates plasma in a plasma region (i.e., the edge region of the substrate 10).

The process gas is uniformly supplied along the periphery of the sidewall of the mask part 1300, and is activated by plasma formed around the periphery of the sidewall of the mask part 1300. Then, a bias voltage is applied to the upper electrode 1310 disposed around the mask part 1300 and the lower electrode 1510 disposed around the substrate support 1500 in order to remove unnecessary layers and particles from the edge region of the substrate 10. For example, bias power having a frequency of 13.56 MHz and a power of 500 W is supplied to the substrate support 1500 to etch away unnecessary layers and particles from the edge region of the substrate 10 exposed to the plasma. Meanwhile, inert gas is supplied to a center region of the mask part 1300 from the inert gas supply unit 1800, so that the process gas which is converted to plasma can be prevented from penetrating to the center region of the substrate 10.

After etching of the edge region of the substrate 10 is completed, plasma generation and supply of the process gas are stopped, and remaining gas is discharged from the chamber 1100. While the remaining gas is being discharged, inert gas may be continuously supplied to completely discharge the process gas inside the chamber to the outside. And the substrate support 1500 is moved down to a lower wall region of the lower chamber 1110). Here, required gas may be supplied into the chamber 1100 depending on situation, and high-frequency power used for antenna and bias may be gradually reduced to maintain plasma until the remaining gas is completely discharged or the substrate support 1500 is moved down, so that the plasma can be gradually extinguished. In this way, defects and particle generation may be reduced. Thereafter, the gate valve 1130 is opened, and the substrate 10 is carried out of the chamber 1100.

The present invention is not limited to the exemplary embodiments described above, and may be changed in various forms.

A plasma etching apparatus and an apparatus for supporting a substrate for the plasma etching apparatus in accordance with a third exemplary embodiment will be described hereafter. In the following descriptions, overlapping portions with the above-described first and second embodiments will be skipped. Some of the following descriptions can be applied to the above-described first and second embodiments.

Figure 19:
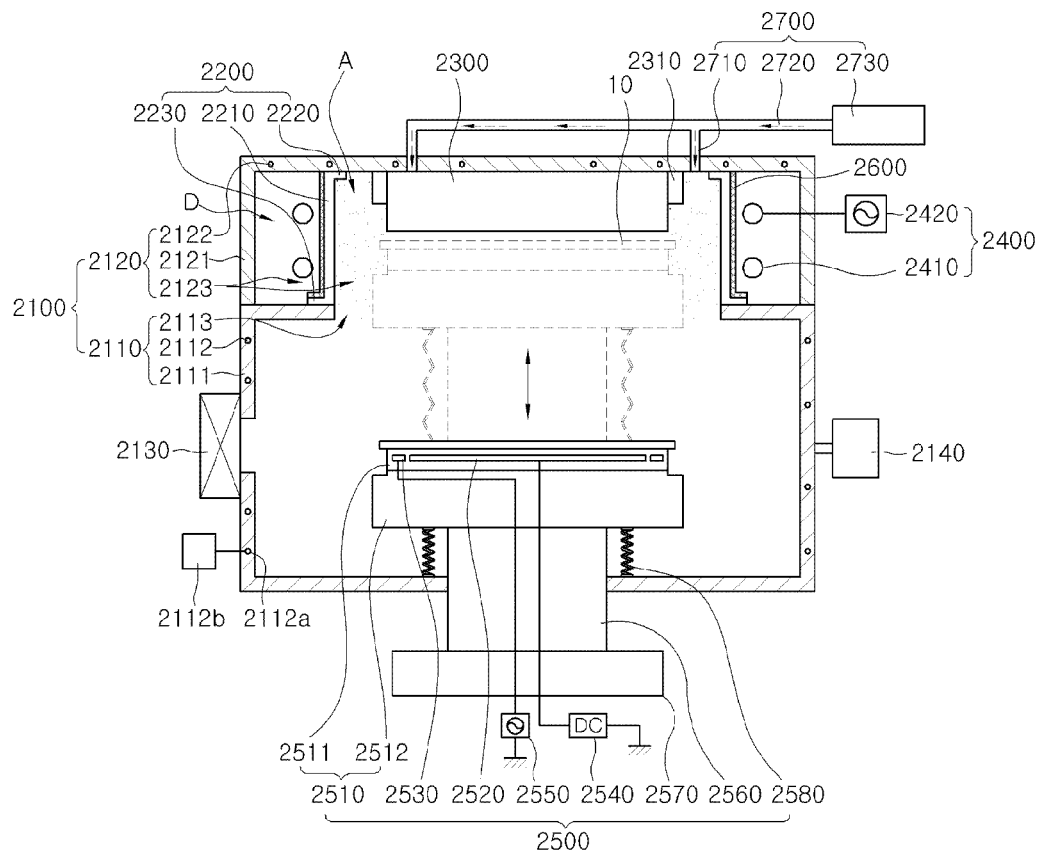
FIG. 19 is a schematic cross-sectional view of a plasma etching apparatus in accordance with a third exemplary embodiment.
Figure 20:
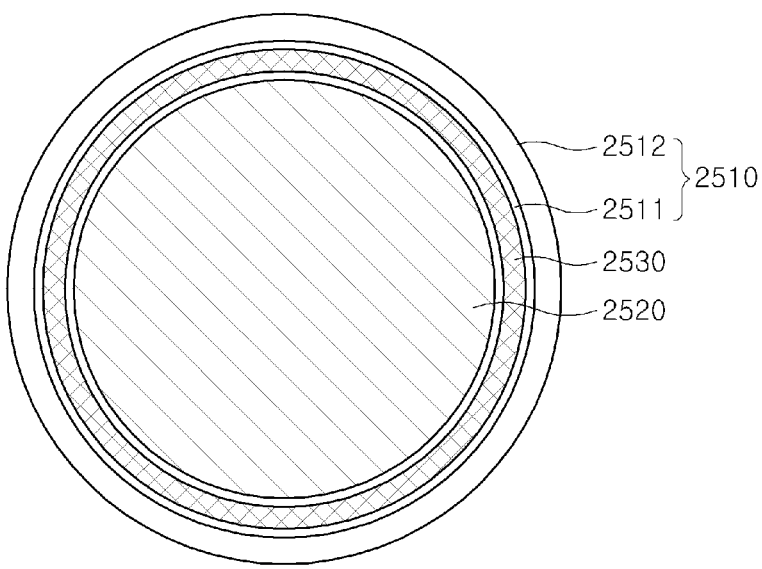
FIG. 20 is a plan view of a substrate support, explaining an electrode pattern in accordance with the third exemplary embodiment.
Figure 21:
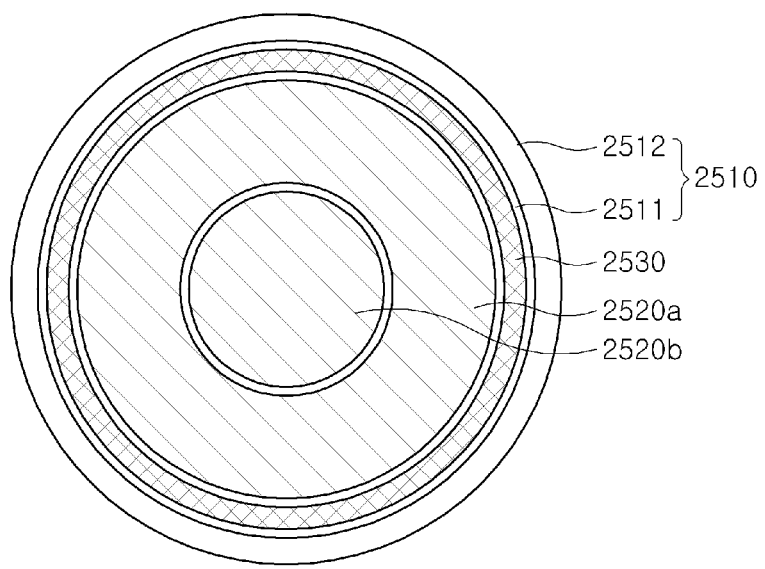
FIG. 21 is a plan view of a substrate support in accordance with a variant of the third exemplary embodiment.
Figure 22:
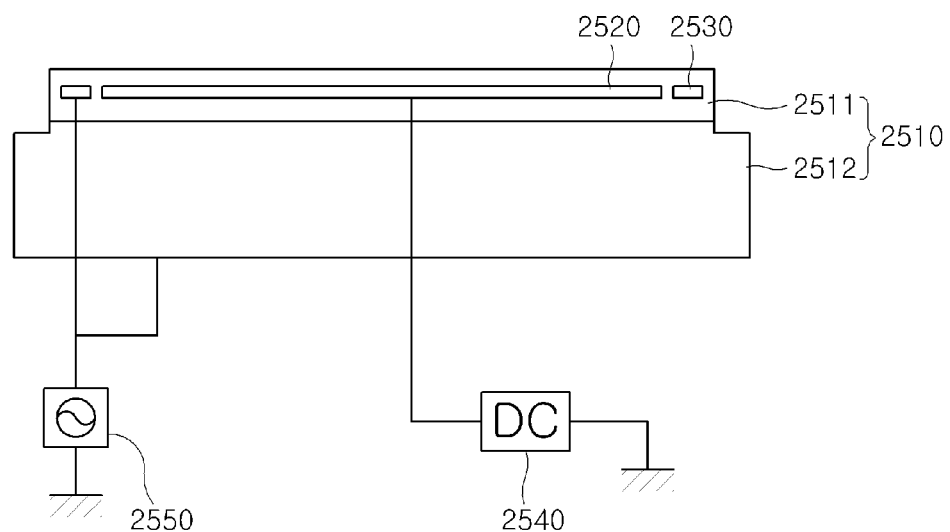
FIG. 22 through 24 are schematic views explaining a voltage application method of a substrate support in accordance with variants of the third exemplary embodiment.
Figure 23:
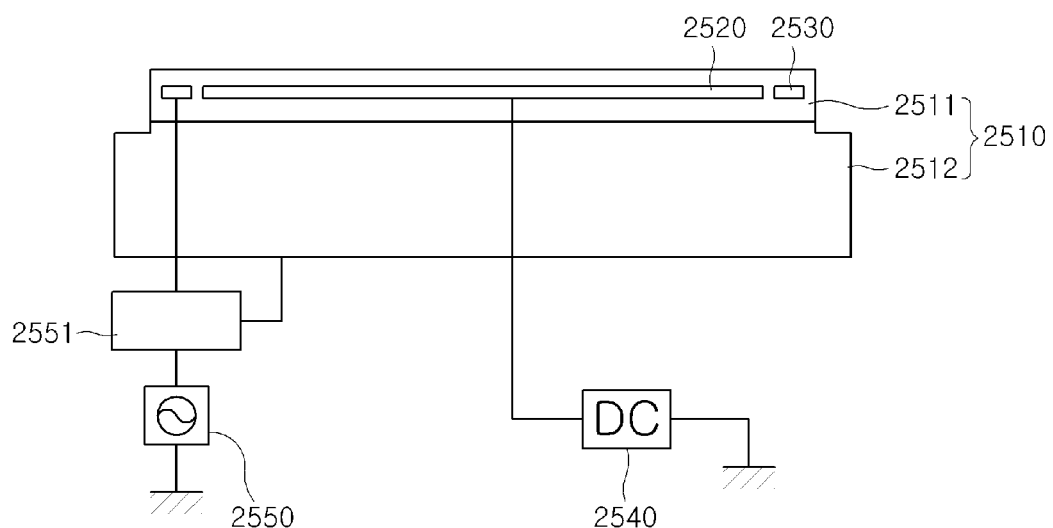
Figure 24:
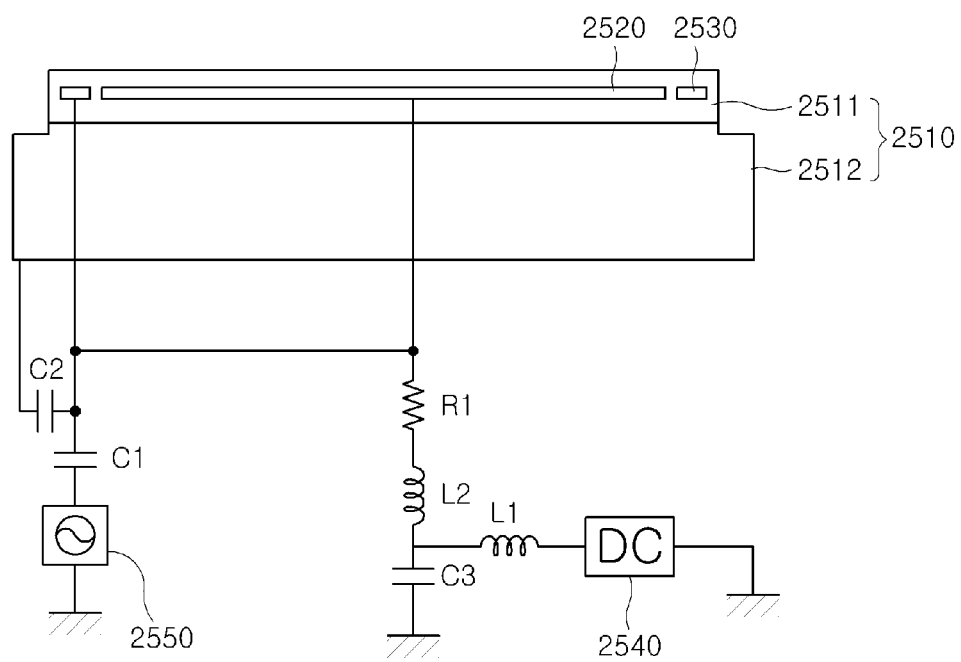
Figure 25:
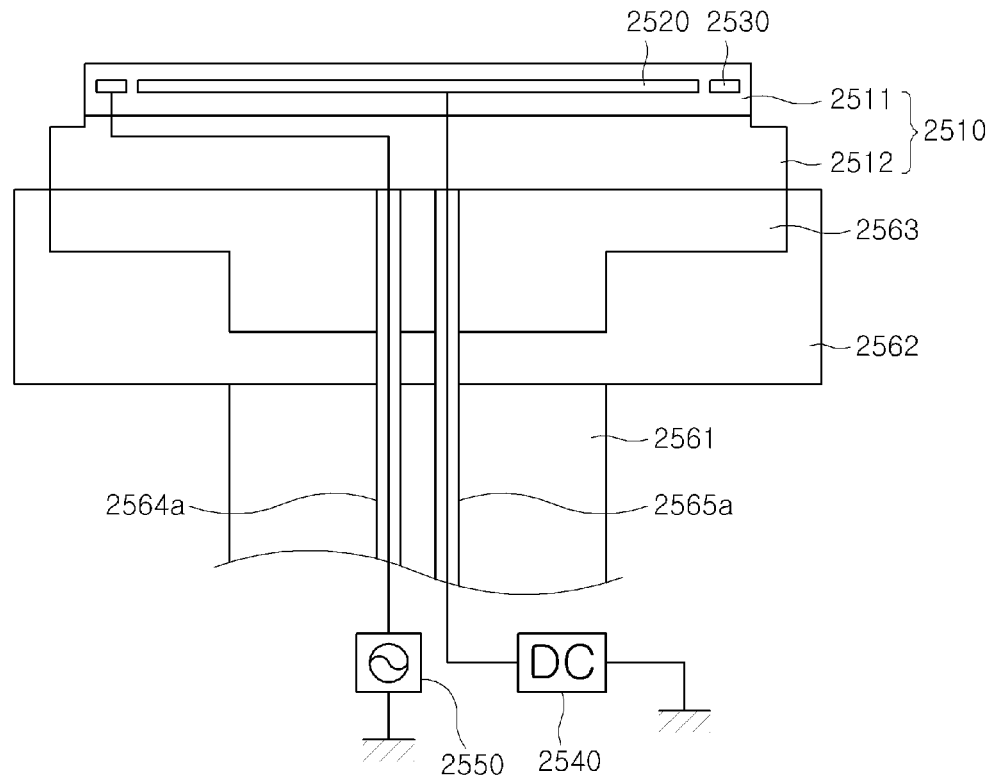
FIG. 25 is a schematic cross-sectional view of a substrate support explaining an elevator in accordance with the third exemplary embodiment.
Figure 26:
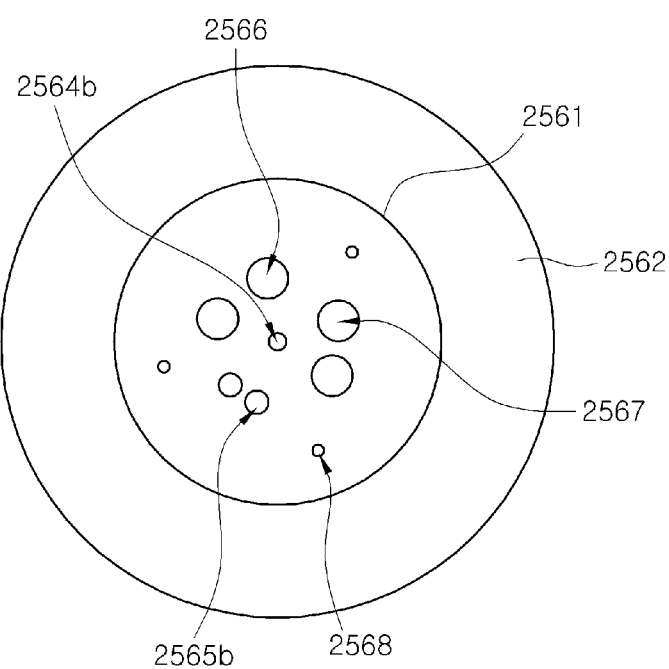
FIG. 26 is a rear side view of an elevator in accordance with the third exemplary embodiment.

FIG. 19 is a schematic cross-sectional view of a plasma etching apparatus in accordance with a third exemplary embodiment. FIG. 20 is a plan view of a substrate support, explaining an electrode pattern in accordance with the third exemplary embodiment. FIG. 21 is a plan view of a substrate support in accordance with a variant of the third exemplary embodiment. FIG. 22 through 24 are schematic views explaining a voltage application method of a substrate support in accordance with variants of the third exemplary embodiment. FIG. 25 is a schematic cross-sectional view of a substrate support explaining an elevator in accordance with the third exemplary embodiment. FIG. 26 is a rear side view of an elevator in accordance with the third exemplary embodiment.

Referring to FIGS. 19 through 26, the plasma etching apparatus includes a chamber 2100, a shied portion 2200 dividing the inside of the chamber 2100 into a reaction compartment A and a separation compartment D, a mask part 2300 provided in the reaction compartment A inside the shield part 2200, a plasma generator 2400 provided in the separation compartment D outside the shield part 2200, and a substrate support 2500 provided below the mask part 2300. The plasma etching apparatus further includes a Faraday shield 2600 disposed between the mask part 2300 and the plasma generator 2400. The central region of a substrate 10 is shielded and the edge region of the substrate 10 is exposed by the mask part 2300 and the substrate support 2500.

The chamber 2100 includes a lower chamber 2110 and an upper chamber 2120 having heating units 2112 and 2122, respectively.

The lower chamber 2110 includes an approximately hexahedral-shaped lower body 2111 whose inner space is empty, lower heating units 2112 disposed on the sidewalls of the lower body 2111, and a circular through hole 2113 formed in the upper wall of the lower body 2111.

The substrate support 2500 supporting a substrate rises and falls through the inner empty space of the lower body 2111. A gate valve 130 loading/unloading the substrate 10, and an exhaust unit 2140 exhausting impurities inside the chamber 2100 are provided to one side of the lower body 2111.

The lower heating unit 2112 heating the chamber 2100 is provided to a portion of at least the sidewall of the lower body 2111. Accordingly, the lower body 2111 is heated and temperature is controlled to prevent the inside temperature of the lower body 2111 from being drastically changed by external influence. The lower heating unit 2112 includes a plurality of hot wires 2112a provided inside or the lateral side of the lower body 2111, and a power supply 2112b supplying power to the hot wires 2112a to generate heat.

The diameter of the through hole 2113 formed in the upper wall of the lower body 2111 may be greater than that of the substrate 10. The substrate support 2500 can elevate to the outside of the lower body 2111 through the through hole 2113.

The upper chamber 2120 includes an about hexahedral-shaped upper body 2121, an upper heating unit 2122 provided to the upper body 2121, and a recess 2123 formed in the upper body 2121. The upper body 2121 may be formed in a shape that can cover a through hole region of the lower body 2111. That is, the lower surface of the upper body 2121 is closely attached on the upper surface of the lower body 2111.

The recess 2123 formed in the upper body 2121 communicates with the through hole 130 of the lower body 2111. For this purpose, as illustrated in FIG. 19, the recess 2123 is formed in a shape in which an opening is formed in the lower wall of the upper body 2121, and which is recessed in the upper wall direction. At this point, the diameter of the recess 2123 may be greater than that of the through hole 2113.

In the embodiment, the substrate 10 is located inside the recess 2123 of the upper chamber 2120 through the elevating operation of the substrate support 2500. At this point, plasma is generated and concentrated on the inner region of the recess 2123 to remove a layer and particles on a substrate edge region.

The upper heating unit 2122 is provided to a portion of the neighboring region of the recess 2123 of the upper body 2121. The heating temperatures of the lower and upper heating units 2112 and 2122 may be around 80° C. Of course, the heating temperature is not limited thereto but the heating operation may be performed at the temperature range of approximately 50 through 150° C.

Though not shown, the chamber 2100 further includes an opening/closing unit opening/closing between the upper body 2121 of the upper chamber 2120 and the lower body 2111 of the lower chamber 2110. As described above, the chamber 2100 is divided into the upper region and the lower region, and the chamber 2100 is manufactured by coupling these regions to each other, so that the maintenance of the chamber 2100 can be easily performed.

The above-described shield part 2200 is formed in a ring shape (or frame shape) extending from the upper wall of the lower chamber 2110 to the upper wall of the upper chamber 2120 via the inside of the recess 2123 of the upper chamber 2120. The shield part 2200 is disposed in the peripheral region around the edge of the through hole 2112 of the lower chamber 2110 to separate the chamber 2100 including the upper chamber 2120 and the lower chamber 2110 into the separation compartment D and the reaction compartment A. The reaction compartment A is a space where the substrate 10 is disposed and plasma is generated to perform a process of etching a substrate edge region. The separation compartment D is a space where a portion of the plasma generator 2400 is located. The separation compartment D and the reaction compartment A may be isolated from each other by the shield part 2200. For example, the separation compartment D can maintain an atmospheric pressure and the reaction compartment A can maintain vacuum.

The reaction compartment A includes the inside region of the shield part 2200 surrounded by the upper wall of the upper chamber 2120 and the shield part 2200, and the inner space of the lower chamber 2110. The separation compartment D includes the outside region of the shield part 2200 surrounded by the upper wall and the lateral wall of the upper chamber 2120, the upper wall of the lower chamber 2110, and the shield part 2200. The shield part 2200 may be manufactured using a material that can transmit high frequency energy to generate plasma therein. For example, the shield part 2200 can be manufactured using an insulator, i.e., $Al_2O_3$.

The shield part 2200 includes a ring-shaped ring body portion 2210 whose inside is empty, and upper and lower extensions 2220 and 2230 provided on the upper and lower extension sides of the ring body portion 2210, respectively.

Also, the shield part 2200 can be fixed to the lower chamber 2110 or the upper chamber 2120 through the lower extension portion 2230 or the upper extension 2220, respectively. Though not shown, a sealing member such as an O-ring, for sealing the reaction compartment A can be further provided to the lower chamber 2110 and the upper chamber 2120 contacting the shield part 2200.

Also, though the shield part 2200 is manufactured separately from the upper and lower chambers 2110 and 2120 in the above description, the shield part 2200 can be integrally formed with the upper and lower chambers 2110 and 2120.

The mask part 2300 blocks plasma generation on the non-etch region, i.e., the central region of the substrate 10 located on the substrate support 2500 to prevent an etching operation from being performed on the non-etch region of the substrate 10. The mask part 2300 is manufactured in a similar shape to that of the substrate 10. In the embodiment, the mask part 2300 is manufactured in a circular plate shape. The mask part 2300 may have a smaller size than that of the substrate 10. Accordingly, the mask part 2300 can selectively expose the edge region of the substrate 10. The edge region of the substrate 10 exposed by the mask part 2300 may be in the range of approximately 0.1 through 5 mm from the end of the substrate 10.

Accordingly, the edge region of the substrate 10 on which a layer or a semiconductor pattern has not been formed can be exposed. That is, when the edge region is smaller than the above range, the exposed area of the edge region reduces, and when the edge region is greater than the above range, there is a possibility that a layer or a pattern on the central region (i.e., the non-etch region) of the substrate 10 is exposed. Also, an inert gas can be sprayed from the inner region of the mask part 2300 to prevent an etching gas in a plasma state from penetrating into the substrate central region corresponding to the inside of the mask part 2300. That is, though not shown, a spray portion spraying an inert gas can be provided to the bottom (i.e., a surface corresponding to the substrate) of the mask part 2300, and a gas passage through which an inert gas moves can be provided inside the mask part 2300.

The mask part 2300 is located in the reaction compartment inside the shield part 2200. The mask part 2300 is provided on the bottom of the recess 2123 of the upper chamber 2120 (that is, the lower surface of the upper wall of the upper chamber 2120) as illustrated. The mask part 2300 may be manufactured through a separate member and then attached on the bottom of the concave portion 2123 using a coupling member. Of course, the mask part 2300 is not limited thereto but can be integrally manufactured with the upper chamber 2120.

An upper electrode 2310 can be provided on the end of the mask part 2300 as illustrated. At this point, grounding power is applied to the upper electrode 2310. Of course, the upper electrode 2310 is not limited thereto but can be provided inside the mask part 2300. Also, a portion of the mask part 2300 can be used as the upper electrode. At this point, an insulating layer is provided on one side of the mask part 2300. The upper electrode 2310 induces coupling of bias power applied to the substrate support 2500 to increase plasma density and thus improves an etching rate around a substrate edge.

The plasma generator 2400 includes an antenna portion 2410 and a power supply 2420. The antenna portion 2410 is provided in the separation compartment D surrounded by the shield part 2200, the upper chamber 2120, and the lower chamber 2110. The antenna portion 2410 includes at least one coil, and is formed in such a shape that the coil surrounds the shield part 2200 N times. Also, plasma can be effectively generated to the edge portion of the substrate 10 when the distance between the substrate 10 and the antenna (coil) closest to the substrate 10 is in the range of approximately 2 through 10 cm. However, when the distance is less than 2 cm, plasma is generated up to the central portion of the substrate, so that unnecessary etching can be generated. On the other hand, when the distance exceeds 10 cm, it is difficult to generate plasma having proper density in the neighborhood of the substrate edge.

The power supply 2420 is a unit supplying an RF power, and supplies high frequency waves to the antenna portion 2410. At this point, the power supply 2420 may be located outside the chamber 2100. Only the antenna portion 2410 of the plasma generator 2400 may be located in the separation compartment inside the chamber 2100, and the other elements may be located outside the chamber 2100. In the embodiment, the antenna portion 2410 is integrally formed with the chamber 2100 inside the chamber 2100, so that the equipment can be simplified and miniaturized. Power of 100 W through 3.0 KW may be supplied through the power supply 2420. Also, the frequency of the power supply 2420 may be in the range of approximately 2 through 13.56 MHz.

When the plasma power (high frequency power) is applied to the antenna portion 2410, plasma is generated in the reaction compartment inside the shield part 2200. The antenna portion 2410 generates high density plasma on a region inside the shield part 2200. Since the mask part 2300 is provided in the region inside the shield part 2200, plasma is generated and concentrated on a region between the mask part 2300 and the shield part 2200, that is, the region between the shield part 2200 and the raised substrate support.

The plasma generator 2400 is not limited to the above-described construction, but can be capacitively coupled plasma (CCP), a hybrid type plasma generator, an electron cyclotron resonance (ECR) plasma generator, or a surface wave plasma (SWP) generator. The plasma generator 2400 may further include a matching unit (not shown) for impedance matching between the power supply 2420 and the antenna portion 2410.

The Faraday shield 2600 is located on the outer surface of the shield part 2200 to allow plasma formed inside the shield part 2200 to be concentrated on a substrate edge region. The Faraday shield 2600 may be provided in a space between the shield part 2200 and the antenna portion 2410. Furthermore, the Faraday shield 2600 prevents local deposition of etch byproducts and polymers at the position of the coil of the inner surface of the shield part 2200, so that minimum amount of the etch byproducts and polymers can be uniformly accumulated in the entire inner surface of the process chamber. Therefore, the lifetime of the plasma etching apparatus can be increased, and particle formation due to irregular separation of impurities accumulated in the chamber during the process can be prevented.

Though not shown, an insulating member for insulation can be provided between the Faraday shield 2600 and the antenna portion 2410. The Faraday shield 2600 may contact the outer surface of the shield part 2200 to maintain a predetermined interval from the coil of the antenna portion generating plasma.

The plasma etching apparatus further includes a gas supply unit 2700 supplying a process gas in the plasma generating region (i.e., the space surrounded by the shield part 2200, the mask part 2300, and the substrate support 2500).

The gas supply unit 2700 includes a spray portion 2710 spraying a process gas into the reaction compartment inside the chamber 2100, a gas pipe 2720 supplying the process gas to the spray portion 2710, and a gas storage 2730 providing the process gas to the gas pipe 2720. The spray portion 2710 is manufactured in the form of a plurality of nozzles and provided to the upper chamber 120 along the periphery of the mask part 2300. With this construction, the process gas can be uniformly supplied to the periphery of the mask part 2300.

Of course, the gas supply unit 2700 is not limited to the above construction, but can supply the process gas through a space between the upper chamber 120 and the mask part 2300. Also, the gas supply unit 2700 can supply the process gas to the plasma generating region through a space between the mask part 2300 and the upper electrode 2310. Also, a portion of the gas supply unit 2700 can pass through the mask part 2300.

The substrate support 2500 in accordance with the embodiment includes a body portion 2510 supporting the substrate 10, a first electrode 2520 provided to the central region of the body portion 2510, a second electrode 2530 separated from the first electrode 2520 and provided in the edge region of the body portion 2510, a fix power supply 2540 supplying a substrate fixing voltage fixing the substrate 10 to the first electrode 2520, and a bias power supply 2550 supplying bias power to the second electrode 2530.

The body portion 2510 includes a chuck 2511 connected with the rear side of the substrate 10 and exposing the edge region of the substrate 10, and a fixing body 2512 fixing the chuck 2511 as illustrated in FIG. 19.

As illustrated in FIG. 19, the diameter of the chuck 2511 may be smaller than that of the substrate 10. Also, the diameter of the fixing body 2512 may be greater than that of the chuck 2511. Of course, the diameter of the fixing body 2512 may be greater than that of the substrate 10. Accordingly, a space can be formed below the edge of the substrate 10 located on the chuck 2511, and plasma can freely flow through the space to effectively etch the lower edge portion of the substrate 10.

The chuck 2511 may be manufactured using ceramic. Of course, the chuck 2511 is not limited thereto but can be manufactured using various materials having insulation. The fixing body 2512 can be manufactured using a material different from that of the chuck 2511. For example, the fixing body 2512 can be manufactured using a conductive material layer. After the fixing body 2512 and the chuck 2511 are manufactured through separate processes, respectively, and then they are coupled to each other. That is, the fixing body 2512 and the chuck 2511 are manufactured separately. The manufacturing of them is not limited thereto but they can be integrally manufactured. The chuck 2511 may have the same shape as that of the substrate 10.

The first electrode 2520 is provided to the upper surface (i.e., the surface contacting the rear side of the substrate 10) of the chuck 2511. Accordingly, the first electrode 2520 can fix the substrate 10 using electromagnetic force.

That is, as illustrated in FIG. 20, the first electrode 2520 is provided in the central portion of the chuck 2511 in a circular plate shape. Of course, the first electrode 2520 is not limited thereto but can be separately manufactured in a plurality of blocks. Referring to the modification of FIG. 21, the first electrode 2520 can include a first electrode block 2520b provided to the central portion of the chuck 2511 in a circular plate shape, and a second electrode block 2520a of a ring shape having a predetermined width around the first electrode block 2520b. Of course, though not shown, the first electrode 2520 can be manufactured in the form of a plurality of fan-shaped blocks arranged in a circular plate configuration. At this point, respective blocks are separately manufactured as illustrated in the modification of FIG. 21. By doing this, a large-sized first electrode 2520 can be manufactured. In this case, each of the separately manufactured blocks can be connected to the fix power supply 2540. Of course, the connection of the blocks is not limited thereto but the blocks can be electrically connected. Also, though not shown, a predetermined cut portion can be provided to each block. Separate members such as a cooling passage and a lift pin can move through the predetermined cut portion.

The second electrode 2530 is provided in a ring shape around the edge of the chuck 2511. That is, the second electrode 2530 is electrically separated from the first electrode 2520 and provided in a region between the first electrode 2520 and the end of the chuck 2511.

The first electrode 2520 is disposed on the center of the chuck 2511 to maintain gripping force of the substrate support 2500 with respect to the substrate 10, and the second electrode 2530 is disposed on the edge of the chuck 2511 to increase plasma density on the substrate edge region. Of course, the configurations of the first electrode and the second electrode are not limited to the above but some of the plurality of blocks forming the first electrode 2520 can be used as the second block 2530. For example, in FIG. 21, the second electrode block can be used as the second electrode 2530, and the only the first electrode block can be used as the first electrode 2520.

In the embodiment, the first electrode 2520 and the second electrode 2530 are manufactured inside the chuck 2511 such that they are electrically separated from each other. With this construction, different powers can be supplied to the first electrode 2520 and the second electrode 2530, respectively.

Therefore, in the embodiment, it is possible to separately manage powers applied to the central region and the edge region of the body portion 2510. That is, the fix power supply 2540 supplies substrate fix power to the first electrode 2520. A DC voltage is used as the substrate fix power of the fix power supply 2540. The substrate 10 is gripped on the central region of the body portion 2510 by the first electrode 2520 that has received the DC voltage. The DC voltage may be in the range of approximately 400 through 2000 V.

The bias power supply 2550 supplies bias power to the second electrode 2530. The bias power supply 2550 may supply power of 10 through 1000 W. RF power is used as the bias power of the bias power supply 2550. The frequency of the bias power may be in the range of approximately 2 through 13.56 MHz. The second electrode 2530 that has received high frequency power can improve the concentration of plasma on the edge region of the body portion 2510. That is, the second electrode 2530 can prevent plasma density reduction caused by a high frequency power loss, and thus prevent the etching rate on the substrate edge region from reducing.

As illustrated in the modification of FIG. 22, the bias power supply 2550 can supply power to not only the second electrode 2530 but also the fixing body 2512. Also, as illustrated in the modification of FIG. 23, a separate splitter 2551 dividing the high frequency power can be further provided to the output end of the bias power supply 2550. With the splitter 2551, the levels of the powers supplied to the second electrode 2530 and the fixing body 2512 can be different from each other. Also, as illustrated in the modification of FIG. 24, a first capacitor C1 is provided between the bias power supply 2550 and the second electrode 2530. A second capacitor C2 is provided between the bias power supply 2550 and the fixing body 2512. That is, the second capacitor C2 may be located between one end of the second electrode 2530 and the fixing body 2512. Also, a first inductor L1, a second inductor L2, and a first resistor R1 are connected in series between the fix power supply 2540 and the fixing body 2512. Also, a third capacitor C3 is provided between the first/second inductors L1/L2 and a ground. A separate power line is connected between the second capacitor C2 and the first resistor R1. Of course, the circuit construction is not limited thereto but DC power and high frequency power can be supplied to the first and second electrodes 2520 and 2530, respectively, through various power application methods.

As described above, since the powers supplied to the central region and the edge region of the body portion 2510 are separated, the damage of the substrate central region can be prevented. Therefore, the damage of the circuit pattern provided on the substrate central region can be minimized.

Also, the substrate support 2500 further includes an elevator 2560 raising the body portion 2510, and a stage 2570 applying driving force to the elevator 2560. Also, the substrate support 2500 further includes a bellows 2580 provided between the body portion 2510 and the bottom of the lower chamber 2110 to seal the chamber 2100, the bellows 2580 surrounding an elevating shaft 2561.

Referring to FIG. 25, the elevator 2560 includes the elevating shaft 2561 delivering the motion force of the stage 2570, an elevation support 2563 fixing the body portion 2510, and a ground portion 2562 between the elevation support 2563 and the elevating shaft 2561. The elevation support 2563 is manufactured in the same size as that of the body portion 2510. Also, the elevation support 2563 is coupled to the body portion 2510 through a predetermined coupling member. The elevation support 2563 is formed of a material having a similar thermal conductivity to that of the fixing body 2512 of the body portion 2510. With this structure, the drastic thermal change of the body portion 2510 may be prevented. Also, the ground portion 2562 is manufactured in a shape surrounding the elevation support 2563 as illustrated in FIG. 25. The ground portion 2562 is connected to a ground to prevent the inside of the elevating shaft 2561 from being damaged by plasma. Also, the ground portion 2562 is manufactured using a material having lower thermal conductivity than that of the elevation support 2563. With this construction, the heat of the elevation support 2563 is prevented from being delivered to the elevating shaft 2561.

Also, the inside of the elevating shaft 2561 is formed in an empty cylinder shape in which a plurality of pipes are provided. That is, referring to FIG. 7, a high frequency line pipe 2564a in which a high frequency power (bias power) line is located, and a DC line pipe 2565a in which a DC power (fixing power) line is located are provided inside the elevating shaft 2561. Though not shown, a refrigerant pipe through which refrigerant moves, and a lift pin pipe through which a lift pin passes are provided inside the elevating shaft 2561.

These pipes extend to the insides of the ground portion 2562 and the elevation support 2563. Accordingly, a plurality of through holes passing through the ground portion 2562 and the elevating support 2563 are provided. That is, referring to FIG. 26, the plurality of through holes include a high frequency through hole 2564b through which the high frequency line pipe 2564a passes, a DC through hole 2565b through which the DC line pipe 2565a passes, a refrigerant through hole 2566 through which the refrigerant pipe passes, and a lift through hole 2568 through which a lift pin pipe passes. Also, a heating through hole 2567 in which a member heating the body portion 2510 extends is further provided.

In the embodiment, referring to FIG. 26, these holes may be arranged in the central region of the elevator 2560 corresponding to the central region of the substrate 10. That is, since the substrate edge etching apparatus in accordance with the embodiment uses only the edge region of the substrate as an etch target, the equipment is very sensitive to changes in a process condition on the edge region. Therefore, the changes in the process condition on the edge region can be minimized by arranging elements that can influence the process condition, such as the high frequency line, the DC line, a refrigerant member, and a heating member in the central region of the elevator 2560.

Also, refrigerant is provided to the body portion 2510 through the central region of the elevator 2560 to prevent the temperature of the substrate from rising. For this purpose, a refrigerant passage through which refrigerant flows is provided to the body portion 2510. Also, a heating member can be provided to the body portion 2510 to heat the substrate to a predetermined temperature. A heating unit connected with the heating member and thus heated is provide to the body portion 2510. The heating temperature of the body portion may be in the range of approximately 150 through 550° C. Also, a separate through hole through which the lift pin passes can be provided to the body portion 2510.

An etching method of the plasma etching apparatus having the above-described construction will be briefly described below.

The gate valve 2130 provided to the sidewall of the chamber 2100 is opened. A substrate is loaded into the inside of the chamber 2100, that is, into the reaction compartment A through the gate valve 2130. The loaded substrate 10 is located on the substrate support 2500.

After the substrate 10 is located on the body portion 2510 of the substrate support 2500, the gate valve 2130 is closed and the pressure of the reaction compartment A inside the chamber 2100 is controlled to an object pressure. At this point, a DC voltage, which is fixing power, is applied to the first electrode 2520 inside the body portion 2510 to grip the substrate 10. Also, the pressure of the reaction compartment A may be less than approximately $1 \times 10^{-3}$ Torr.

Subsequently, the body portion 2510 is elevated and moved to the inside of the recess 2123 of the upper chamber 2120. At this point, the body portion 2510 of the substrate support 2500 is positioned closely to the mask part 2300 provided inside the recess 2123.

In the embodiment, the substrate 10, the body portion 2510, and the mask part 2300 are manufactured in circular shapes, and the centers of them coincide with one another. With this structure, the edge region of the substrate 10 is exposed to the outside the body portion 2510 and the mask part 2300.

When a distance between the mask part 2300 and the substrate 10 is close, plasma is not generated on a substrate region below the mask part 2300. That is, the distance between the body portion 2510 and the mask part 2300 is maintained in the range of approximately 0.1 through 10 mm. The above range is maintained to prevent plasma from being generated on a region where the body portion 2510 and the mask part 2300 are closely located.

Subsequently, a process gas is supplied to the reaction compartment A through the gas supply unit 2700, and the plasma generator 2400 generates plasma in the reaction compartment A to which the process gas is supplied. Through this process, a process gas in a plasma state is generated. At this point, the process pressure may be in the range of approximately 5 through 500 mTorr.

When high frequency power is applied to the antenna portion 2410 provided in the space outside the shield part (that is, the separation region D), and ground power is applied to the upper electrode 2310 on the lateral side of the mask part 2300 and the second electrode 2530 in the lateral side of the substrate support 2500, plasma is generated in a space between the upper electrode and the second electrode, that is, a space inside the shield part. That is, for example, high frequency power having a frequency of 2 MHz and power of 1.5 KW is supplied to the antenna portion 2410 to generate plasma in the substrate edge region.

At this point, the process gas is uniformly sprayed along the periphery of the mask part 2300, and activated by plasma. Also, the Faraday shield 2600 provided on the inner surface of the shield part 2200 allows the process gas in the plasma state to be concentrated on the substrate edge region. At this point, bias power is applied to the upper electrode 2310 provided on the lateral side of the mask part 2300, and to the second electrode 2530 inside the body portion 2510 to remove a layer and particles on the substrate edge region. For example, when bias power having a frequency of 13.56 MHz and power of 500 W is supplied to the second electrode 2530 of the body portion 2510, the substrate edge region exposed to the plasma by the bias power is etched. In the embodiment, even when a metal layer is formed on the substrate edge region, the metal layer deposited on the substrate is heated by a heating unit provided inside or on the lateral side of the chamber 2100 or inside the body portion 2510, and then the substrate edge region is etched using activated plasma, so that the metal layer can be removed.

After the etching of the substrate edge region is completed, the plasma generation and process gas injection are stopped, and a residual gas inside the chamber 2100 is exhausted. Also, the body portion 2510 gripping the substrate is lowered down to the lower wall region of the lower chamber 2110. At this point, a necessary gas is injected when needed, and the bias high frequency power applied to the antenna portion is gradually reduced, so that the process plasma is maintained and gradually disappears until the residual gas is exhausted or the body portion 2510 is lowered. By doing so, particle accumulation and defect may be reduced. After that, the gate valve 2130 is opened and the process-completed substrate 10 is unloaded to the outside of the chamber 2100.

The invention claimed is:

1. A plasma etching apparatus, comprising:
   a chamber comprising a compartment;
   a plasma generator disposed at the chamber;
   a mask part disposed in the compartment;
   a substrate support disposed under the mask part;
   a gas supply unit configured to supply a process gas to the compartment; and
   a shield part;

wherein:
the chamber comprises upper and lower chambers that are detachably coupled to each other,
a through hole is disposed in an upper wall of the lower chamber,
the upper chamber comprises a recess corresponding to the through hole,
the mask part is disposed at a lower surface of an upper wall of the upper chamber,
the shield part is disposed in the chamber and formed to have a ring shape extending from the upper wall of the lower chamber to the upper wall of the upper chamber,
the shield part is disposed along a periphery of the through hole of the lower chamber to divide the chamber into a reaction compartment and a separation compartment,
a diameter of the recess is greater than that of the through hole,
the substrate support is disposed in the reaction compartment of the chamber and supports a substrate, and
the substrate support moves the substrate loaded into the lower chamber to the recess of the upper chamber or moves the substrate lifted to the recess down to the lower chamber.

2. The plasma etching apparatus of claim 1, wherein the upper and lower chambers include a heating unit.

3. The plasma etching apparatus of claim 2, wherein the heating unit comprises:
a hot wire disposed in walls of the upper and lower chambers or on sides of the upper and lower chambers; and
a power supply configured to supply power to the hot wire.

4. The plasma etching apparatus of claim 1, wherein the plasma generator comprises:
an antenna part disposed in the separation compartment outside the shield part; and
a plasma power supply configured to supply plasma power to the antenna part.

5. The plasma etching apparatus of claim 1, further comprising a Faraday shield disposed around a periphery of the shield part.

6. The plasma etching apparatus of claim 1, wherein the substrate support is configured to expose an edge region of the substrate having approximately 0.1 mm to 5 mm width,
the substrate support is disposed adjacent to the mask part so that the distance between the substrate support and the mask part is approximately 0.1 mm to 10 mm, and
the mask part has the same diameter as the substrate support or the substrate.

7. The plasma etching apparatus of claim 1, wherein the substrate support comprises a body portion on which a substrate is seated;
a first electrode provided at a central region inside the body portion;
a second electrode provided at an edge region inside the body portion;
a fixing power supply unit configured to supply power to the first electrode to fix the substrate; and
a bias power supply unit configured to supply bias power to the second electrode.

8. The plasma etching apparatus of claim 1 further comprising:
an upper electrode disposed at a peripheral portion of the mask part;
a lower electrode disposed at a peripheral portion of the substrate support; and
an insulation layer disposed between the lower electrode and the substrate support.

9. The plasma etching apparatus of claim 1, further comprising a substrate heating unit disposed in the substrate support for heating the substrate support.

10. The plasma etching apparatus of claim 1, wherein the gas supply unit comprises:
an inert gas supply unit configured to supply an inert gas to a bottom surface region of the mask part; and
a process gas supply unit configured to supply a process gas to a lateral surface region of the mask part.

11. The plasma etching apparatus of claim 10, wherein the inert gas supply unit comprises an inert gas tank, and an extension passage extending from the inert gas tank into the mask part;
a plurality of branch passages branching off from the extension passage; and
a plurality of injection nozzle parts extending from the branch passages to a bottom surface of the mask part.

12. The plasma etching apparatus of claim 11, wherein each of the injection nozzle parts comprises:
an injection hole disposed in the bottom surface of the mask part; and
a nozzle passage connected between the injection hole and the branch passage, wherein the nozzle passage tapers toward the injection hole.

13. The plasma etching apparatus of claim 10, comprising a baffle configured to uniformly inject inert gas from the inert gas supply unit to the bottom surface region of the mask part.

14. The plasma etching apparatus of claim 10, wherein the process gas supply unit comprises:
a process gas tank;
a gas pipe extending to a sidewall surface region of the mask part through the mask part; and
an injector disposed along a sidewall surface of the mask part for injecting a process gas received from the gas pipe.

* * * * *